United States Patent
Tanaka

(10) Patent No.: US 12,432,978 B2
(45) Date of Patent: Sep. 30, 2025

(54) THIN-FILM TRANSISTOR SUBSTRATE HAVING FIRST AND SECOND INSULATING FILMS

(71) Applicant: Wuhan Tianma Micro-Electronics Co., Ltd., Wuhan (CN)

(72) Inventor: Jun Tanaka, Kanagawa (JP)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 820 days.

(21) Appl. No.: 17/484,059

(22) Filed: Sep. 24, 2021

(65) Prior Publication Data

US 2022/0102560 A1    Mar. 31, 2022

(30) Foreign Application Priority Data

Sep. 25, 2020  (JP) ................... 2020-161161
Jun. 29, 2021  (JP) ................... 2021-107777

(51) Int. Cl.
| H01L 29/786 | (2006.01) |
| H01L 29/66 | (2006.01) |
| H10D 30/01 | (2025.01) |
| H10D 30/67 | (2025.01) |
| H10K 59/12 | (2023.01) |
| H10K 59/121 | (2023.01) |

(52) U.S. Cl.
CPC ..... H10D 30/6745 (2025.01); H10D 30/0321 (2025.01); H10D 30/6755 (2025.01);
(Continued)

(58) Field of Classification Search
CPC ........... H01L 29/78672; H01L 29/6675; H01L 29/7869; H01L 27/1248; H01L 27/1255;
(Continued)

(56) References Cited

U.S. PATENT DOCUMENTS

| 7,566,904 B2 * | 7/2009 | Ishii ................ H10D 86/60 |
| | | 349/43 |
| 7,932,521 B2 * | 4/2011 | Akimoto ........... H01L 21/02164 |
| | | 257/E33.013 |

(Continued)

FOREIGN PATENT DOCUMENTS

| CN | 101464579 B | * 7/2012 | ........... G02F 1/1362 |
| JP | 2004341539 A | 12/2004 | |
| JP | 2009169394 A | 7/2009 | |

OTHER PUBLICATIONS

Office Action, issued in Japanese Patent Application No. 2021-107777 dated Mar. 4, 2025, concise explanation of the relevance.

Primary Examiner — Eva Y Montalvo
Assistant Examiner — Pratiksha Jayant Lohakare
(74) Attorney, Agent, or Firm — NIXON & VANDERHYE

(57) ABSTRACT

A first thin-film transistor includes a polysilicon film. A second thin-film transistor includes an oxide semiconductor film. A first insulating film is located upper than the polysilicon film and the oxide semiconductor film. The first insulating film is in contact with the oxide semiconductor film and covers at least a part of the polysilicon film and at least a part of the oxide semiconductor film. A second insulating film is located upper than the first insulating film and contains hydrogen at a concentration higher than the first insulating film. The first insulating film includes a first part and a second part. The first part includes a part covering the at least a part of the polysilicon film. The second part includes a part covering the at least a part of the oxide semiconductor film. The first part is thinner than the second part.

10 Claims, 16 Drawing Sheets

(52) U.S. Cl.
CPC ..... *H10K 59/1213* (2023.02); *H10K 59/1216* (2023.02); *H10K 59/1201* (2023.02)

(58) Field of Classification Search
CPC ............ H01L 27/1225; H10K 59/1213; H10K 59/1216; H10K 59/1201; H10D 30/6745; H10D 30/0321; H10D 30/6755; H10D 10/821; H10D 84/953; A23B 11/86; H10F 30/222
USPC ......................................................... 257/288
See application file for complete search history.

(56) References Cited

U.S. PATENT DOCUMENTS

| | | | |
|---|---|---|---|
| 7,999,259 | B2 | 8/2011 | Ikeda et al. |
| 8,247,814 | B2 * | 8/2012 | Maekawa .......... H10D 30/6732 257/E27.06 |
| 8,889,480 | B2 * | 11/2014 | Takechi ............. H10D 30/6755 438/151 |
| 9,093,537 | B2 * | 7/2015 | Lee .................... H10D 30/0321 |
| 9,412,800 | B2 * | 8/2016 | Kim ................... H10K 59/1213 |
| 2004/0227895 | A1 * | 11/2004 | Yoo ........................ G02F 1/1339 349/152 |
| 2006/0238135 | A1 * | 10/2006 | Kimura .................... G09G 3/20 315/169.3 |
| 2009/0159901 | A1 | 6/2009 | Ikeda et al. |
| 2015/0153861 | A1 * | 6/2015 | Yamazaki ............. G06F 3/0412 |
| 2017/0062490 | A1 | 3/2017 | Noh |
| 2018/0061868 | A1 * | 3/2018 | Na .................. H01L 29/78672 |
| 2018/0061922 | A1 * | 3/2018 | Kim ................... H10K 59/1216 |
| 2018/0119931 | A1 * | 5/2018 | Bower ................ H01L 25/0753 |
| 2018/0182832 | A1 | 6/2018 | Lee et al. |
| 2020/0219954 | A1 * | 7/2020 | Jeong ................. H10D 30/6755 |

* cited by examiner

THIN-FILM TRANSISTOR SUBSTRATE HAVING FIRST AND SECOND INSULATING FILMS

CROSS-REFERENCE TO RELATED APPLICATIONS

This non-provisional application claims priority under 35 U.S.C. § 119(a) on Patent Application No. 2020-161161 filed in Japan on Sep. 25, 2020, and Patent Application No. 2021-107777 filed in Japan on Jun. 29, 2021, the entire contents of which are hereby incorporated by reference.

BACKGROUND

This disclosure relates to a thin-film transistor substrate.

A technology of incorporating a low-temperature polysilicon thin-film transistor (LTPS TFT) and an oxide semiconductor TFT into one pixel circuit is available for practical use. This technology is referred to as hybrid TFT display (HTD) technology in this description. The HTD technology incorporates both a low-temperature polysilicon TFT having high mobility and an oxide semiconductor TFT that generates small leakage current in a pixel circuit to achieve higher display quality and lower power consumption.

SUMMARY

An aspect of this disclosure is a thin-film transistor substrate including: an insulating substrate; a first thin-film transistor disposed on the insulating substrate and including an active film as a polysilicon film; a second thin-film transistor disposed on the insulating substrate and including an active film as an oxide semiconductor film located upper than the polysilicon film; a first insulating film located upper than the polysilicon film and the oxide semiconductor film, the first insulating film being in contact with the oxide semiconductor film and covering at least a part of the polysilicon film and at least a part of the oxide semiconductor film when viewed planarly; and a second insulating film located upper than the first insulating film, the second insulating film covering the at least a part of the polysilicon film and the at least a part of the oxide semiconductor film when viewed planarly and containing hydrogen at a concentration higher than a concentration of hydrogen in the first insulating film. Wherein the first insulating film includes a first part and a second part. Wherein the first part includes a part covering the at least a part of the polysilicon film. Wherein the second part includes a part covering the at least a part of the oxide semiconductor film. Wherein the first part is thinner than the second part.

An aspect of this disclosure is a method of manufacturing a thin-film transistor substrate, including: forming a polysilicon film on an insulating substrate as an active film of a first thin-film transistor; forming an oxide semiconductor film on a layer upper than the polysilicon film on the insulating substrate as an active film of a second thin-film transistor after forming the polysilicon film; forming a first insulating film on a layer upper than the oxide semiconductor film after forming the oxide semiconductor film; and forming a second insulating film on a layer upper than the first insulating film after forming the first insulating film, the second insulating film containing hydrogen at a concentration higher than a concentration of hydrogen in the first insulating film. Wherein the first insulating film is in contact with the oxide semiconductor film and covers at least a part of the polysilicon film and at least a part of the oxide semiconductor film when viewed planarly. Wherein the first insulating film includes a first part and a second part. Wherein the first part includes a part covering the at least a part of the polysilicon film. Wherein the second part includes a part covering the at least a part of the oxide semiconductor film. Wherein the second insulating film covers the at least a part of the polysilicon film and the at least a part of the oxide semiconductor film when viewed planarly. Wherein the forming the first insulating film includes etching the first insulating film to make the first part thinner than the second part.

It is to be understood that both the foregoing general description and the following detailed description are exemplary and explanatory and are not restrictive of this disclosure.

EMBODIMENTS

Figure 1:
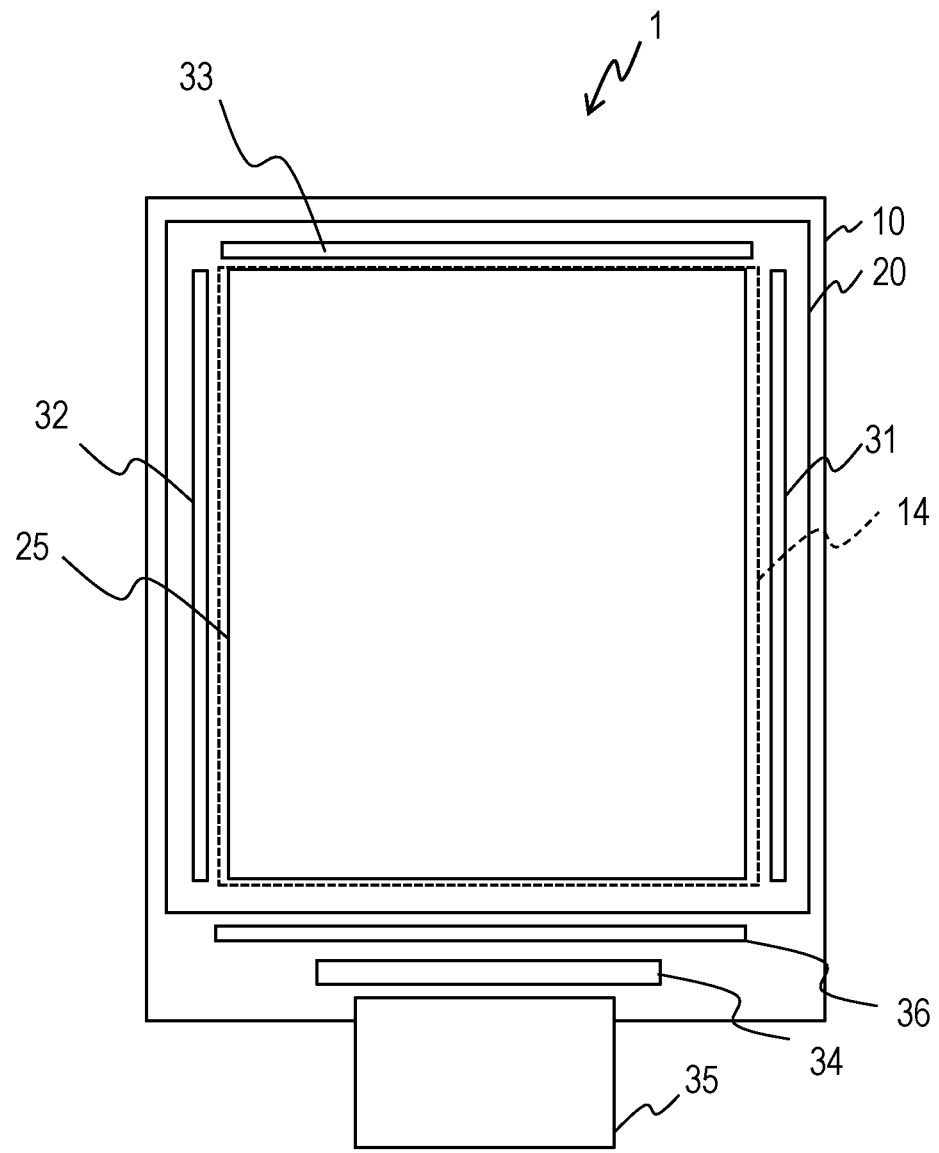
FIG. 1 schematically illustrates a configuration example of an OLED display device.

Hereinafter, embodiments of this disclosure will be described with reference to the accompanying drawings. It should be noted that the embodiments are merely examples to implement this disclosure and are not to limit the technical scope of this disclosure. Elements common to the drawings are denoted by the same reference signs and some elements in the drawings are exaggerated in size or shape for clear understanding of the description.

Overview

The following description employs an organic light-emitting diode (OLED) display device as an example of a device including a thin-film transistor substrate. The OLED display device in this disclosure includes a low-temperature polysilicon thin-film transistor (LTPS TFT) and an oxide semiconductor TFT in a pixel circuit and/or a peripheral circuit. Since the oxide semiconductor TFT generates small leakage current, it can be used as a switch transistor connected with a storage capacitor for maintaining the gate potential of a driving transistor of a pixel circuit, for example. The low-temperature polysilicon TFT having high mobility can be used as a driving transistor, for example. The configuration of this disclosure is applicable to a device different from a display device.

Low-temperature polysilicon and oxide semiconductor have different requirements on hydrogen. When oxide semiconductor is reduced with hydrogen, excess carriers are generated. Accordingly, it is important that the oxide semiconductor contain less hydrogen. From this point of view, it is important that the concentration of hydrogen in the insulating film that is in contact with the oxide semiconductor film be low.

On the other hand, low-temperature polysilicon requires much hydrogen to terminate the dangling bonds at the crystal grain boundary. A low-temperature polysilicon TFT including a low-temperature polysilicon film lacking in hydrogen deteriorates in TFT characteristics such as hysteresis; it affects the display quality of the OLED display device. Further, it may reduce in mobility to impair the driving capability of a circuit such as a gate driver.

Typical hydrogenation of low-temperature polysilicon supplies hydrogen to the low-temperature polysilicon by letting an insulating film including much hydrogen diffuse hydrogen. In general, fabrication of a circuit including a low-temperature polysilicon TFT and an oxide semiconductor TFT prepares the low-temperature polysilicon film before the oxide semiconductor film. To attain oxide semiconductor containing less hydrogen, the insulating films to be in contact with the oxide semiconductor and insulating films upper than these films are made of a hydrogen-poor insulating material such as SiOx. Accordingly, the amount of hydrogen supplied to the low-temperature polysilicon becomes smaller.

Meanwhile, hydrogen in low-temperature polysilicon can go out during the process to fabricate an oxide semiconductor TFT. For example, the process to fabricate an oxide semiconductor TFT includes a plurality of times of annealing. For a highly reliable oxide semiconductor TFT, temperature from 300° C. to 400° C. is required. This high-temperature annealing removes hydrogen from low-temperature polysilicon.

As described above, the low-temperature polysilicon TFT suffers from limitations of the oxide semiconductor TFT. When a hydrogen-poor insulating film such as a SiOx film is used to attain an oxide semiconductor film containing less hydrogen, the amount of hydrogen supplied to the low-temperature polysilicon film could be insufficient. The process to fabricate an oxide semiconductor TFT may further reduce the hydrogen in the low-temperature polysilicon. For these reasons, a structure and a manufacturing process to prevent the lack of hydrogen in the low-temperature polysilicon TFT are demanded.

The thin-film transistor substrate in an embodiment of this specification includes a low-temperature polysilicon film and an oxide semiconductor film provided upper than the low-temperature polysilicon film. The thin-film transistor substrate further includes a hydrogen-poor insulating film upper than and in contact with the oxide semiconductor film and a hydrogen-rich insulating film provided upper than the hydrogen-poor insulating film. The hydrogen-poor insulating film above the low-temperature polysilicon film is thinner than the hydrogen-poor insulating film above the oxide semiconductor film. This configuration reduces the deterioration of the characteristics of the oxide semiconductor film but increases the hydrogen supplied from the hydrogen-rich insulating film to the low-temperature polysilicon film to mitigate the lack of hydrogen in the low-temperature polysilicon film.

Embodiment 1

Configuration of Display Device

FIG. 1 schematically illustrates a configuration example of an OLED display device 1. The OLED display device 1 includes a thin-film transistor (TFT) substrate 10 on which organic light-emitting elements (OLED elements) and pixel circuits are fabricated, a thin-film encapsulation (TFE) 20 for encapsulating the organic light-emitting elements. The thin-film encapsulation 20 is a kind of structural encapsulation unit. Another example of a structural encapsulation unit includes an encapsulation substrate for encapsulating organic light-emitting elements and a bond (glass frit sealer) for bonding the TFT substrate 10 with the encapsulation substrate. The space between the TFT substrate 10 and the encapsulation substrate is filled with dry nitrogen, for example.

In the periphery of a cathode electrode region 14 outer than the display region 25 of the TFT substrate 10, a scanning driver 31, an emission driver 32, a protection circuit 33, a driver IC 34, and a demultiplexer 36 are provided. The driver IC 34 is connected to the external devices via flexible printed circuits (FPC) 35.

The scanning driver 31 drives scanning lines on the TFT substrate 10. The emission driver 32 drives emission control lines to control the light emission periods of pixels. The driver IC 34 is mounted with an anisotropic conductive film (ACF), for example.

The protection circuit 33 protects the elements in the pixel circuits from electrostatic discharge. The driver IC 34 provides power and timing signals (control signals) to the scanning driver 31 and the emission driver 32 and further, provides power and a data signal to the demultiplexer 36.

The demultiplexer 36 outputs output of one pin of the driver IC 34 to d data lines in series (d is an integer more than 1). The demultiplexer 36 changes the output data line for the data signal from the driver IC 34 d times per scanning period to drive d times as many data lines as output pins of the driver IC 34. These scanning driver 31, emission driver 32, protection circuit 33, and demultiplexer 36 are peripheral circuits fabricated on the TFT substrate 10.

Configuration of Pixel Circuit

Figure 2A:
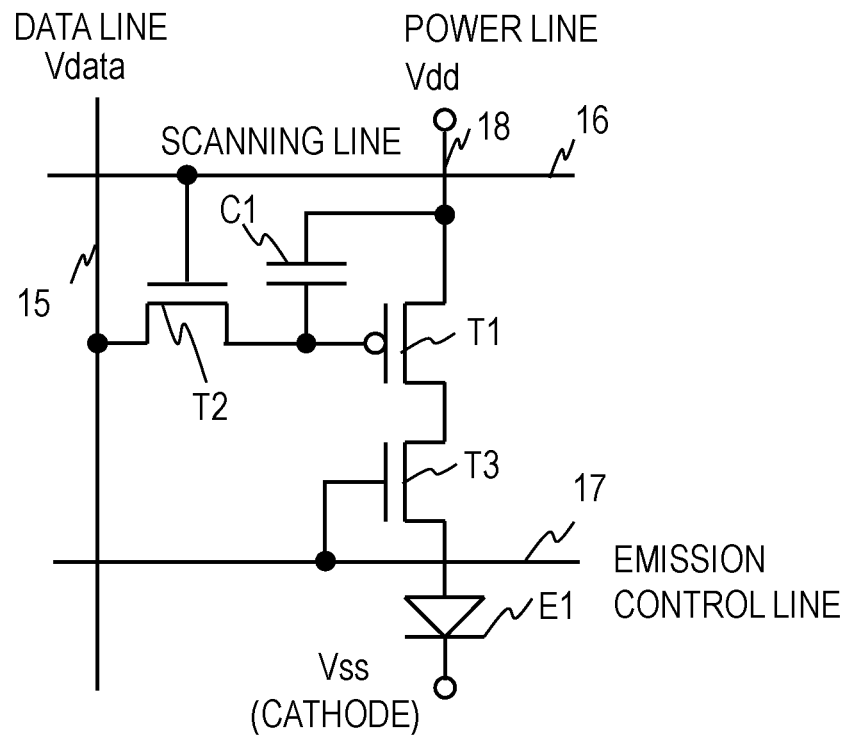
FIG. 2A illustrates a configuration example of a pixel circuit.

A plurality of pixel circuits are fabricated on the TFT substrate 10 to control electric current to be supplied to the anode electrodes of subpixels (also simply referred to as pixels). FIG. 2A illustrates a configuration example of a pixel circuit. Each pixel circuit includes a driving transistor T1, a selection transistor T2, an emission transistor T3, and a storage capacitor C1. The pixel circuit controls light emission of an OLED element E1. The transistors are TFTs. The transistors except for the driving transistor T1 are switch transistors.

The selection transistor T2 is a switch for selecting the subpixel. The selection transistor T2 is an n-channel type of oxide semiconductor TFT and its gate terminal is connected with a scanning line 16. The source terminal is connected with a data line 15. The drain terminal is connected with the gate terminal of the driving transistor T1.

The driving transistor T1 is a transistor (driving TFT) for driving the OLED element E1. The driving transistor T1 is a p-channel type of low-temperature polysilicon TFT and its gate terminal is connected with the drain terminal of the selection transistor T2. The source terminal of the driving transistor T1 is connected with a power line (Vdd) 18. The drain terminal is connected with the source terminal of the emission transistor T3. The storage capacitor C1 is provided between the gate terminal and the source terminal of the driving transistor T1.

The emission transistor T3 is a switch for controlling supply/stop of the driving current to the OLED element E1. The emission transistor T3 is an n-channel type of oxide semiconductor TFT and its gate terminal is connected with an emission control line 17. The source terminal of the emission transistor T3 is connected with the drain terminal of the driving transistor T1. The drain terminal of the emission transistor T3 is connected with the OLED element E1.

Next, operation of the pixel circuit is described. The scanning driver 31 outputs a selection pulse to the scanning line 16 to turn on the selection transistor T2. The data voltage supplied from the driver IC 34 through the data line 15 is stored to the storage capacitor C1. The storage capacitor C1 holds the stored voltage during the period of one frame. The conductance of the driving transistor T1 changes in an analog manner in accordance with the stored voltage, so that the driving transistor T1 supplies a forward bias current corresponding to a light emission level to the OLED element E1.

The emission transistor T3 is located on the supply path of the driving current. The emission driver 32 outputs a control signal to the emission control line 17 to control ON/OFF of the emission transistor T3. When the emission transistor T3 is ON, the driving current is supplied to the OLED element E1. When the emission transistor T3 is OFF, this supply is stopped. The lighting period (duty ratio) in the period of one frame can be controlled by controlling ON/OFF of the transistor T3.

Figure 2B:
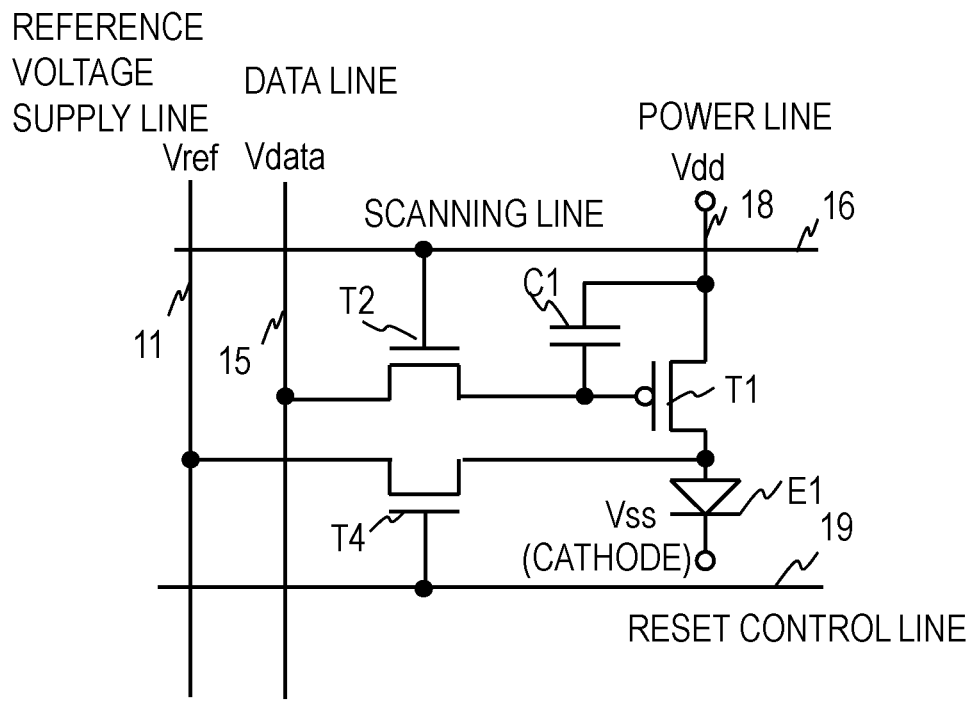
FIG. 2B illustrates another configuration example of a pixel circuit.

FIG. 2B illustrates another configuration example of a pixel circuit. This pixel circuit includes a reset transistor T4 in place of the emission transistor T3 in FIG. 2A. The reset transistor T4 is an n-channel type of oxide semiconductor TFT. The reset transistor T4 controls the electric connection between a reference voltage supply line 11 and the anode of the OLED element E1. This control is performed in accordance with a reset control signal supplied from a reset control line 19 to the gate terminal of the reset transistor T4. This reset transistor T4 can be used for various purposes.

Figure 2C:
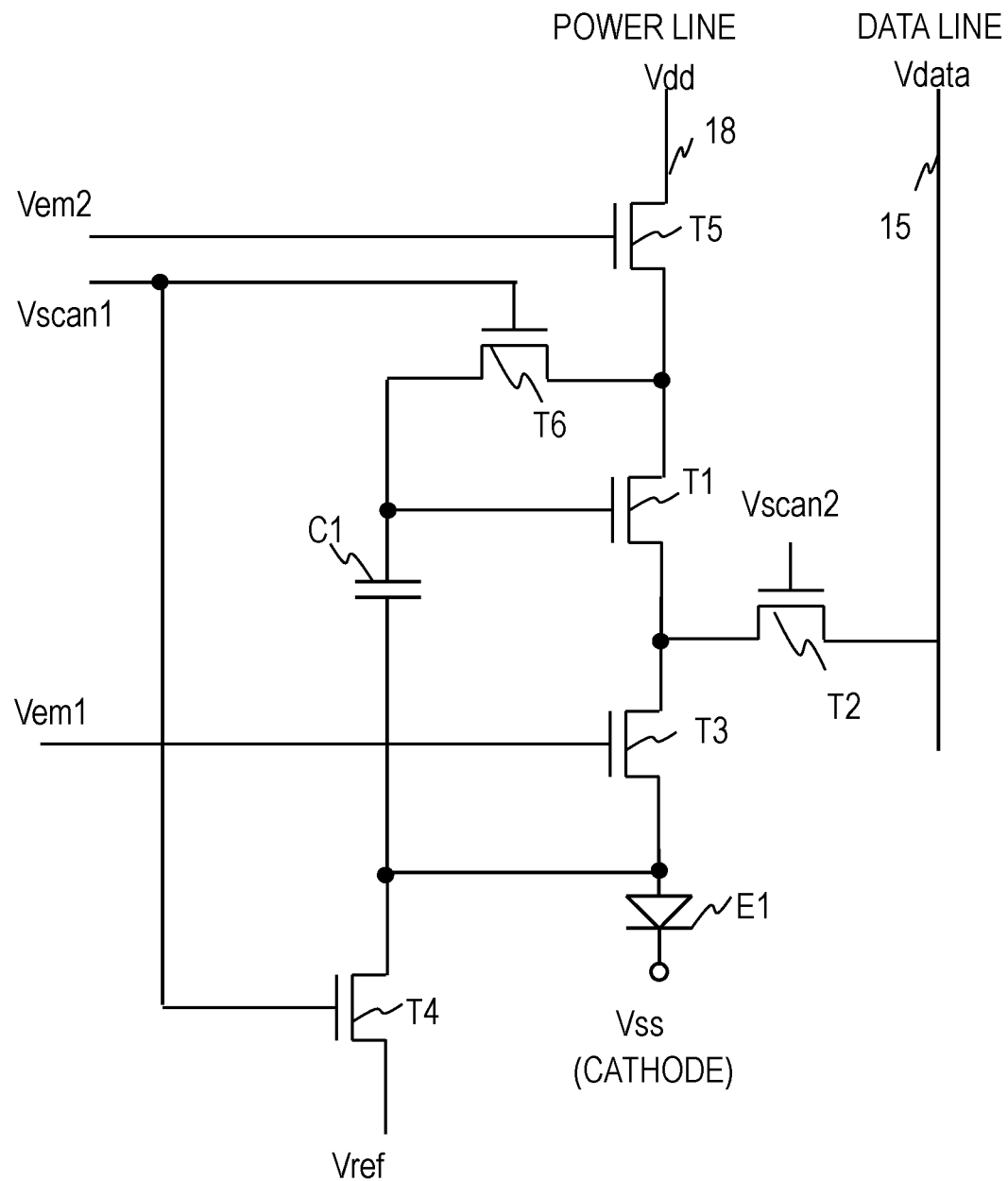
FIG. 2C illustrates still another configuration example of a pixel circuit.

FIG. 2C illustrates still another configuration example of a pixel circuit. This pixel circuit includes n-channel type of transistors T1 to T6. The gate terminal of the selection transistor T2 is supplied with a Vscan2 signal. A storage capacitor C1 is supplied with a data voltage through the selection transistor T2. The gates of the transistors T4 and T6 are supplied with a Vscan1 signal.

The transistors T4 and T6 supply Vref to the anode of an OLED element E1 to set a threshold voltage to the storage capacitor C1. The gates of the transistors T3 and T5 are supplied with signals Vem1 and Vem2, respectively, to control light emission of the OLED element E1. The transistors except for the driving transistor T1 are switch transistors.

The driving transistor T1 can be a low-temperature polysilicon TFT and the transistor T6 can be an oxide semiconductor TFT. The other transistors can be a low-temperature polysilicon TFT or an oxide semiconductor TFT. The circuit configurations in FIGS. 2A, 2B, and 2C are examples; the pixel circuit may have a different circuit configuration.

The pixel circuits described above include a low-temperature polysilicon TFT and an oxide semiconductor TFT. The configurations described in this specification improve the characteristics of the low-temperature polysilicon TFTs and the oxide semiconductor TFTs.

Configuration of Thin-Film Transistor Substrate

Hereinafter, configuration examples of a thin-film transistor substrate including low-temperature polysilicon TFTs and oxide semiconductor TFTs are described. The oxide semiconductor can be indium gallium zinc oxide (IGZO). The configurations described in this specification are applicable to elements made of other oxide semiconductors.

Figure 3:
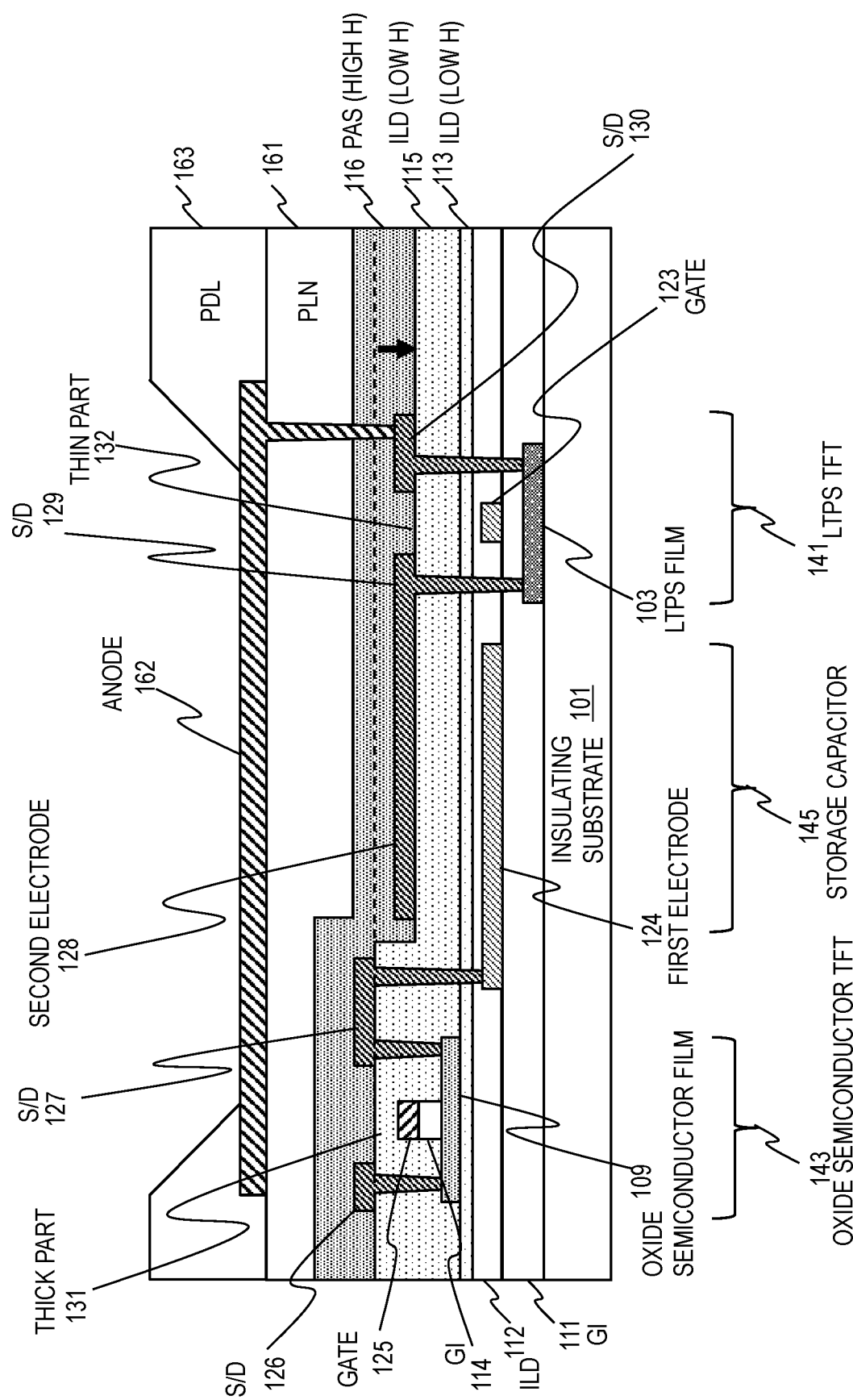
FIG. 3 schematically illustrates a cross-sectional structure of a part of a thin-film transistor substrate.

FIG. 3 schematically illustrates a cross-sectional structure of a part of a thin-film transistor substrate. A low-temperature polysilicon TFT 141, an oxide semiconductor TFT 143, and a storage capacitor 145 are fabricated on an insulating substrate 101. Further, the anode electrode 162 of an OLED element is connected with a source/drain electrode 130 of the low-temperature polysilicon TFT 141. The other elements of the OLED element are omitted in FIG. 3.

The low-temperature polysilicon TFT 141 includes a low-temperature polysilicon film 103, a gate electrode 123, a gate insulating film between the gate electrode 123 and the low-temperature polysilicon film 103, and source/drain electrodes 129 and 130. The gate insulating film is a part of a gate insulating (GI) film 111.

The oxide semiconductor TFT 143 includes an oxide semiconductor film 109, a gate electrode 125, a gate insulating film 114 between the gate electrode 125 and the oxide semiconductor film 109, and source/drain electrodes 126 and 127.

The storage capacitor 145 includes a first electrode 124 of a lower electrode, a second electrode 128 of an upper electrode, and an insulating film sandwiched between the first electrode 124 and the second electrode 128. The insulating film has a layered structure; parts of the insulating films 112, 113, and 115 are layered. The first electrode 124 is connected with the source/drain electrode 127 of the oxide semiconductor TFT 143. The second electrode 128 is connected with the source/drain electrode 129 of the low-temperature polysilicon TFT 141.

Hereinafter, elements of the thin-film transistor substrate are described in the order from the lowest layer toward the uppermost layer in FIG. 3. The insulating substrate 101 is a flexible or inflexible substrate made of resin or glass. The low-temperature polysilicon film 103 is an active film; it includes a channel and low-resistive regions sandwiching the channel in an in-plane direction. The channel is made of low-temperature polysilicon not reduced in resistance (highly-resistive low-temperature polysilicon). The low-resistive regions are made of low-temperature polysilicon reduced in resistance by being doped with high-concentration impurities; they are connected with the source/drain electrodes 129 and 130.

The low-temperature polysilicon film 103 is included in a low-temperature polysilicon layer. The low-temperature polysilicon layer includes the low-temperature polysilicon films of a plurality of low-temperature polysilicon TFTs. Although the low-temperature polysilicon film 103 in the example of FIG. 3 is in contact with the insulating substrate 101, another insulating layer such as a silicon nitride layer can be provided therebetween.

The gate insulating film 111 is provided to cover the low-temperature polysilicon film 103. The gate insulating film 111 can be made of silicon oxide (SiOx). The gate insulating film of the low-temperature polysilicon TFT 141 is a part of the gate insulating film 111; it is located between the gate electrode 123 and the polysilicon film 103 in the layering direction. The gate insulating film is in contact with the polysilicon film 103 and the gate electrode 123. The gate insulating film 111 can be composed of a plurality of layers.

The gate electrode 123 is provided above the gate insulating film 111. The gate electrode 123 is made of metal and included in a first metal layer. The material of the first metal layer can be selected desirably; for example, Mo, W, Nb, or Al can be employed. Although the low-temperature polysilicon TFT 141 in the example of FIG. 3 has a top-gate structure, the low-temperature polysilicon TFT 141 can have a bottom-gate structure.

The first electrode 124 of the storage capacitor 145 is provided above the gate insulating film 111. The first electrode 124 is included in the same first metal layer including the gate electrode 123 and made of the same material as the gate electrode 123.

An interlayer insulating film (ILD) 112 is provided to cover the gate electrode 123, the first electrode 124, and the gate insulating film 111. The interlayer insulating film 112 can be a silicon oxide film or a silicon nitride (SiNx) film. Another interlayer insulating film 113 is laid above the interlayer insulating film 112. The interlayer insulating film 113 is a hydrogen-poor insulating film such as a silicon oxide film.

The oxide semiconductor film 109 is provided above and in contact with the interlayer insulating film 113. The oxide semiconductor film 109 is an active film; it includes a channel and low-resistive regions sandwiching the channel in an in-plane direction. The low-resistive regions are made of IGZO reduced in resistance. The source/drain electrodes 126 and 127 are connected with the low-resistive regions. The oxide semiconductor film 109 is included in an oxide semiconductor layer. The oxide semiconductor layer includes the oxide semiconductor films of a plurality of oxide semiconductor TFTs.

The gate insulating film 114 and the gate electrode 125 are laid above the channel of the oxide semiconductor film 109. The channel of the oxide semiconductor film 109, the gate insulating film 114, and the gate electrode 125 are laid in this order from the bottom (from the side closer to the insulating substrate 101); the gate insulating film 114 is in contact with the channel of the oxide semiconductor film 109 and the gate electrode 125.

The gate insulating film 114 can be made of silicon oxide. The gate electrode 125 is made of metal and included in a second metal layer. The gate electrode 125 can be made of material like the one for the gate electrode 123 of the low-temperature polysilicon TFT 141. Although the oxide semiconductor TFT 143 in the example of FIG. 3 has a top-gate structure, the oxide semiconductor TFT 143 can have a bottom-gate structure.

An interlayer insulating film 115 is provided to cover the oxide semiconductor film 109, the gate insulating film 114, and the gate electrode 125. The interlayer insulating film 115 covers a part of the interlayer insulating film 113. The interlayer insulating film 115 is in contact with the oxide semiconductor film 109. The entire oxide semiconductor film 109 is covered with the interlayer insulating film 113 thereunder and the interlayer insulating film 115 thereabove.

The interlayer insulating film 115 is a hydrogen-poor insulating film such as a silicon oxide film. The concentration of the hydrogen in the hydrogen-poor insulating films 113 and 115 can be at most $1E21$ atoms/cm$^3$. The hydrogen-poor insulating film can be made of silicon oxide prepared by plasma enhanced chemical vapor deposition (PECVD) or silicon nitride produced from hydrogen-free material. In addition to these, an AlOx film prepared by atomic layer deposition (ALD) or a TaOx film prepared by sputtering can also be employed. Since the insulating films 113 and 115 in contact with the oxide semiconductor film 109 are hydrogen-poor insulator, they prevent increase of carriers because of the supplied hydrogen.

The interlayer insulating film 115 has different thicknesses depending on the position. Specifically, when viewed in the layering direction (in a planar view), the part covering the low-temperature polysilicon film 103 is thinner than the part covering the oxide semiconductor film 109. The part sandwiched between two electrodes 124 and 128 of the storage capacitor 145 is equal to or thinner than the part covering the oxide semiconductor film 109.

The interlayer insulating film 115 in the configuration example of FIG. 3 has a thick part (a second part) 131 and a thin part (a first part) 132. The thick part 131 covers the oxide semiconductor film 109. The thin part 132 covers the low-temperature polysilicon film 103. The thin part 132 is partially included in the storage capacitor 145. The part included in the storage capacitor 145 has the same thickness as the part covering the low-temperature polysilicon film 103. The effects of the different thicknesses of the interlayer insulating film 115 will be described later.

The source/drain electrodes 126 and 127 of the oxide semiconductor TFT 143 and the source/drain electrodes 129 and 130 of the low-temperature polysilicon TFT 141 are provided above the interlayer insulating film 115. Further, the second electrode 128 of the storage capacitor 145 is provided above the interlayer insulating film 115. The source/drain electrodes 126, 127, 129, and 130 and the second electrode 128 are included in a third metal layer and they are made of the same material. The material for the third metal layer can be selected desirably; for example, Al or Ti can be employed.

The source/drain electrodes 126 and 127 of the oxide semiconductor TFT 143 are provided above the thick part 131 of the interlayer insulating film 115. The source/drain electrode 126 of the oxide semiconductor TFT 143 is in contact with one low-resistive region of the oxide semiconductor film 109 through a contact hole opened through the interlayer insulating film 115.

The source/drain electrode 127 is in contact with the other low-resistive region of the oxide semiconductor film 109 through a contact hole opened through the interlayer insulating film 115. The source/drain electrode 127 is also in contact with the first electrode 124 of the storage capacitor 145 through a contact hole opened through the interlayer insulating films 115, 113, and 112.

The source/drain electrodes 129 and 130 of the low-temperature polysilicon TFT 141 are provided above the thin part 132 of the interlayer insulating film 115. The source/drain electrode 129 and 130 of the low-temperature polysilicon TFT 141 are in contact with the low-resistive regions of the low-temperature polysilicon film 103 through contact holes opened through the interlayer insulating films 115, 113, and 112 and the gate insulating film 111.

The second electrode 128 of the storage capacitor 145 is continued from the source/drain electrode 129 of the low-temperature polysilicon TFT 141. An insulating film having a layered structure composed of parts of the interlayer insulating films 112, 113, and 115 is located in the region where the second electrode 128 and the first electrode 124 are opposed to each other (their overlap region in a planar view).

A passivation film (PAS) 116 is provided to cover the source/drain electrodes 126, 127, 129, and 130 and the second electrode 128. The passivation film 116 is in contact with and covers a part of the interlayer insulating film 115. The passivation film 116 is isolated from the oxide semiconductor film 109 by the interlayer insulating film 115. The interlayer insulating film 115 and the passivation film 116 are a first insulating film and a second insulating film, respectively.

The passivation film 116 is a hydrogen-rich insulating film such as a silicon nitride film. The concentration of the hydrogen in the passivation film 116 is higher than those of the interlayer insulating films 113 and 115. The concentration of the hydrogen in the passivation film 116 can be at least 2E21 atoms/cm$^3$.

The passivation film 116 supplies hydrogen to the low-temperature polysilicon film 103 when the passivation film 116 is being formed or subsequently annealed. The supplied hydrogen terminates the dangling bonds at the crystal grain boundary of the low-temperature polysilicon film 103. The low-temperature polysilicon film 103 attains required characteristics with the hydrogen supplied from the passivation film 116.

As described above, the interlayer insulating film 115 is thinner in the part covering the low-temperature polysilicon film 103 than in the part covering the oxide semiconductor film 109. This configuration makes the hydrogen-rich passivation film 116 closer to the low-temperature polysilicon film 103. The thick part 131 of the hydrogen-poor interlayer insulating film 115 functions as a barrier film against hydrogen for the oxide semiconductor film 109.

Because of this difference in thickness of the interlayer insulating film 115, the passivation film 116 can effectively supply hydrogen to the low-temperature polysilicon film 103 and further, reduce the effect of the hydrogen from the passivation film 116 onto the oxide semiconductor film 109 to achieve the characteristics desired for the oxide semiconductor film 109.

As described above, the interlayer insulating film 115 is thin in the part included in the storage capacitor 145, like in the part covering the low-temperature polysilicon film 103. This configuration provides higher capacitance to the storage capacitor 145. The part of the interlayer insulating film 115 included in the storage capacitor 145 can be thinner than the part covering the low-temperature polysilicon film 103, or thinner than the part covering the oxide semiconductor film 109 but thicker than the part covering the low-temperature polysilicon film 103. The part of the interlayer insulating film 115 included in the storage capacitor 145 can be as thick as the part covering the oxide semiconductor film 109.

The storage capacitor 145 can include parts of the interlayer insulating film 115 having different thicknesses.

An insulating planarization film (PLN) 161 is laid above the passivation film 116. The planarization film 161 can be made of an organic material. An anode electrode 162 is provided above the planarization film 161. The anode electrode 162 is in contact with the source/drain electrode 130 of the low-temperature polysilicon TFT 141 through a contact hole in the planarization film 161 and the passivation film 116.

The anode electrode 162 can include three layers of a transparent film of ITO or IZO, a reflective film of a metal such as Ag, Mg, Al, Pt, or Mo or an alloy containing such a metal, and another transparent film as mentioned above, for example. This three-layer structure of the anode electrode 162 is merely an example; the anode electrode 162 can have a two-layer structure.

Above the anode electrode 162, an insulating pixel defining layer (PDL) 163 is provided to separate OLED elements. The pixel defining layer 163 can be made of an organic material. An OLED element is provided in an opening of the pixel defining layer 163. A not-shown organic light-emitting film is provided above the anode electrode 162. The organic light-emitting film consists of, for example, a hole injection layer, a hole transport layer, a light-emitting layer, an electron transport layer, and an electron injection layer in this order from the bottom. The layered structure of the organic light-emitting film is determined depending on the design.

Furthermore, a not-shown cathode electrode is provided above the organic light-emitting film. The cathode electrode transmits part of the visible light coming from the organic light-emitting film. The stack of the anode electrode 162, the organic light-emitting film, and the cathode electrode provided within an opening of the pixel defining layer 163 corresponds to an OLED element.

In the configuration example illustrated in FIG. 3, the thick part 131 of the interlayer insulating film 115 covers the entire oxide semiconductor film 109 when viewed planarly. This configuration effectively prevents degradation of the characteristics of the oxide semiconductor film 109. In another example, the thick part 131 of the interlayer insulating film 115 can cover only a part of the oxide semiconductor film 109.

In the configuration example illustrated in FIG. 3, the thin part 132 of the interlayer insulating film 115 covers the entire low-temperature polysilicon film 103 when viewed planarly. This configuration effectively prevents lack of hydrogen in the low-temperature polysilicon film 103. In another example, the thin part 132 of the interlayer insulating film 115 can cover only a part of the low-temperature polysilicon film 103.

Figure 4:
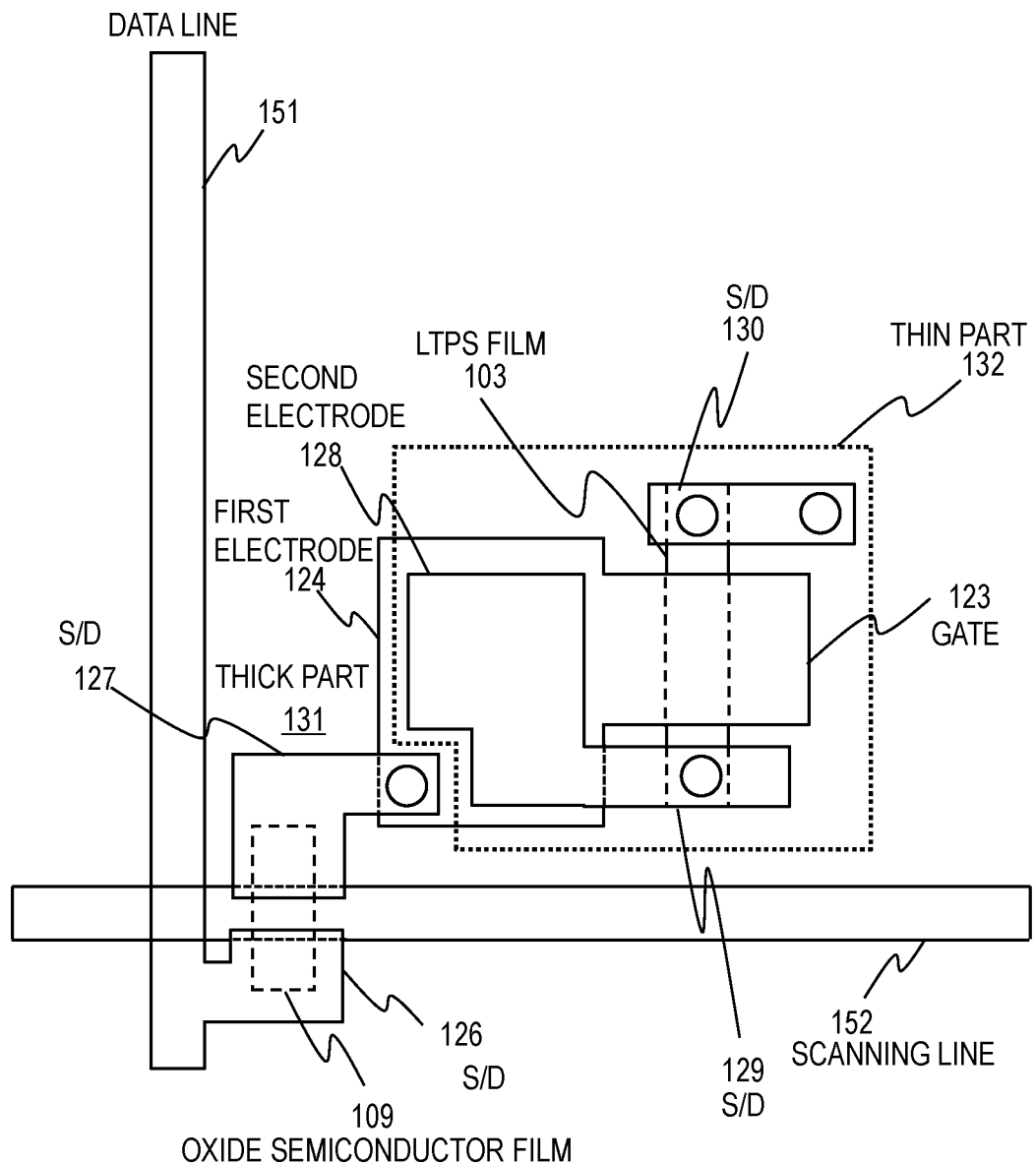
FIG. 4 schematically illustrates an example of the planar structure of a part of a thin-film transistor substrate.

FIG. 4 schematically illustrates an example of the planar structure of a part of a thin-film transistor substrate. A data line 151 extends vertically and a scanning line 152 extends horizontally in FIG. 4. The gate electrode 125 (not shown in FIG. 4) of the oxide semiconductor TFT 143 is a part of the scanning line 152.

In FIG. 4, the thin part 132 of the interlayer insulating film 115 is surrounded by a dotted line and its surroundings are all the thick part 131 of the interlayer insulating film 115. The thin part 132 overlaps the whole low-temperature polysilicon TFT 141 including the low-temperature polysilicon film 103 when viewed planarly. The thin part 132 further occupies the entire region where the two electrodes 124 and 128 of the storage capacitor 145 are opposed to each other. The thick part 131 overlaps the whole oxide semiconductor TFT 143 including the oxide semiconductor film 109 when viewed planarly.

In the configuration example of FIG. 4, the region occupied by the thick part 131 is larger than the region occupied by the thin part 132. More specifically, only the overlap region with the low-temperature polysilicon TFT 141 and the storage capacitor 145 and its neighboring region are included in the thin part 132 and the other region is included in the thick part 131.

Figure 5:
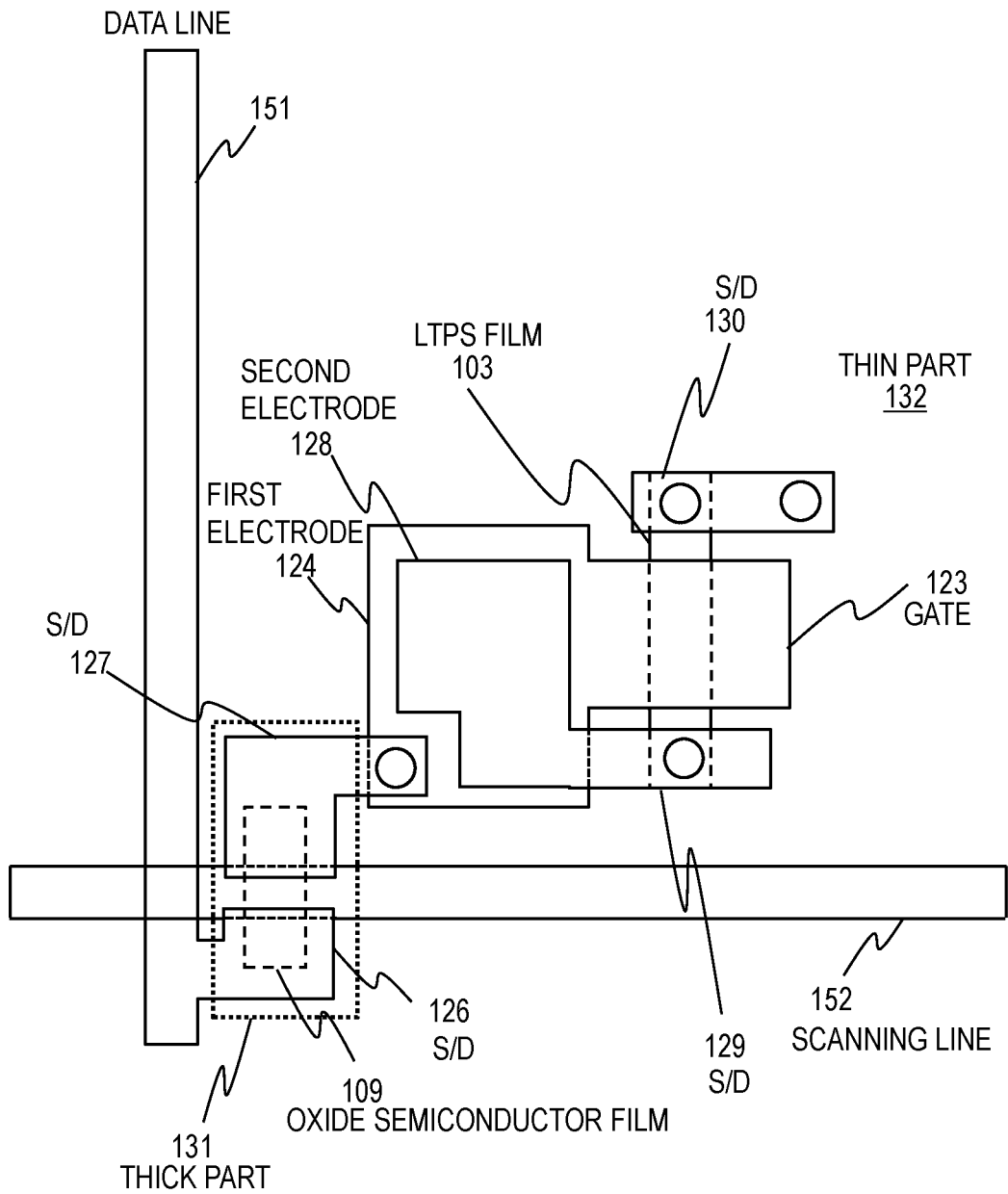
FIG. 5 schematically illustrates another example of the planar structure of a part of a thin-film transistor substrate.

FIG. 5 schematically illustrates another example of the planar structure of a part of a thin-film transistor substrate. Unlike the configuration example of FIG. 4, the region occupied by the thin part 132 is larger than the region occupied by the thick part 131. More specifically, only the overlap region with the oxide semiconductor TFT 143 and its neighboring region are included in the thick part 131 and the other region is included in the thin part 132. This configuration can be employed in a thin-film transistor substrate including oxide semiconductor TFTs fewer than low-temperature polysilicon TFTs, for example.

Manufacturing Method

Figure 6A:
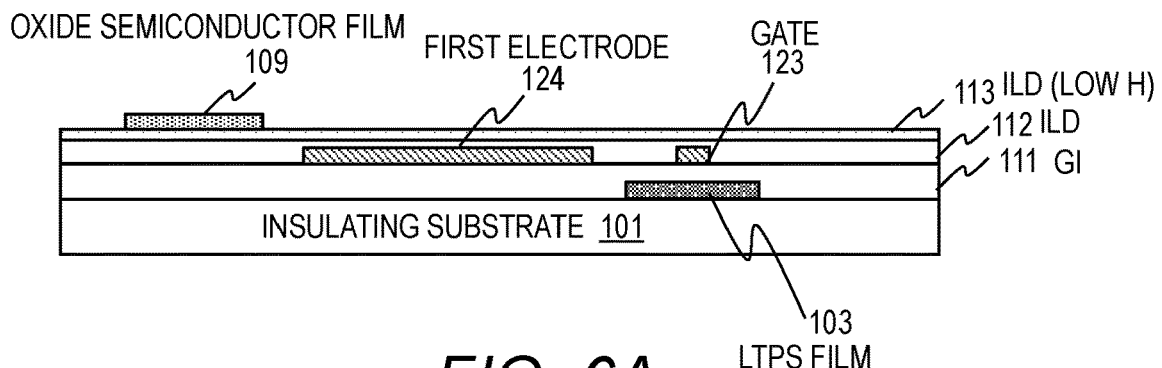
FIG. 6A is a diagram for illustrating a method of manufacturing a thin-film transistor substrate.

A method of manufacturing the structure illustrated in FIG. 3 is described with reference to FIGS. 6A to 6F. As illustrated in FIG. 6A, the manufacturing forms a low-temperature polysilicon film 103 on an insulating substrate 101. Specifically, the manufacturing deposits amorphous silicon on the insulating substrate 101 by PECVD and crystalizes the amorphous silicon by excimer laser annealing to form a low-temperature polysilicon film. The manufacturing patterns the low-temperature polysilicon film by photolithography to form an island-like polysilicon film 103.

Next, the manufacturing forms a gate insulating film 111 by PECVD, for example. Further, the manufacturing forms a first metal layer by sputtering and patterns the first metal layer by photolithography to form a gate electrode 123 and a first electrode 124. Further, the manufacturing injects impurities to the low-temperature polysilicon film 103 using the gate electrode 123 as a mask to prepare low-resistive regions.

Next, the manufacturing forms an interlayer insulating film 112 by PECVD and further, forms a hydrogen-poor interlayer insulating film 113 by PECVD. Next, the manufacturing forms an oxide semiconductor layer on the hydrogen-poor interlayer insulating film 113 by sputtering and patterns the oxide semiconductor layer by photolithography. As a result, an oxide semiconductor film 109 is formed.

Figure 6B:
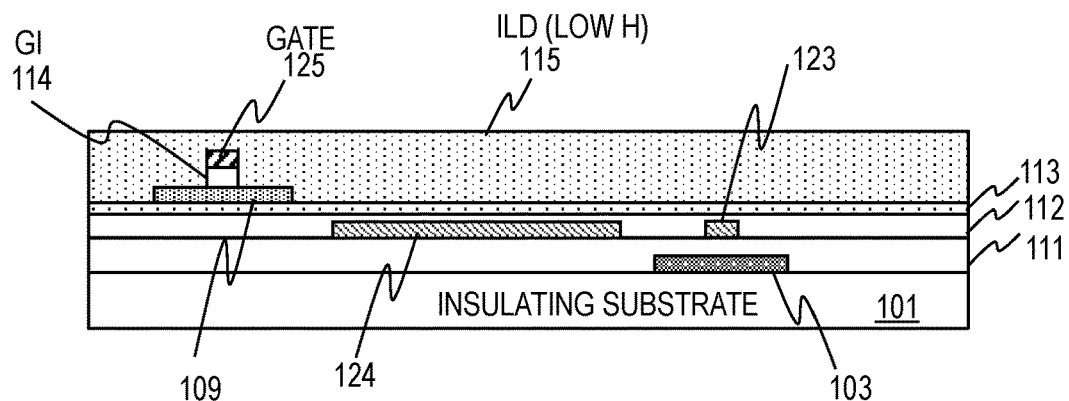
FIG. 6B is a diagram for illustrating a method of manufacturing a thin-film transistor substrate.

Next, with reference to FIG. 6B, the manufacturing forms an insulating film including a gate insulating film 114 by PECVD. Further, the manufacturing forms a second metal layer by sputtering and patterns the second metal layer by photolithography to form a gate electrode 125.

Next, the manufacturing patterns the insulating film using the gate electrode 125 as a mask to form a gate insulating film 114. In another example, the manufacturing patterns the insulating film by photolithography and etching together with the gate electrode 125. Further, the manufacturing reduces the resistance of the end regions of the oxide semiconductor film 109 using the gate electrode 125 as a mask. The resistance can be reduced by exposing the oxide semiconductor film 109 in the regions that are not covered with the gate electrode 125 to He plasma. Next, the manufacturing forms an interlayer insulating film 115 by PECVD. The interlayer insulating film 115 contacts and covers the oxide semiconductor film 109 in the parts that are not covered with the gate electrodes 125. The interlayer insulating film 115 is a hydrogen-poor insulating film such as a silicon oxide film formed by PECVD or a silicon nitride film formed by PECVD of a hydrogen-free material.

Figure 6C:
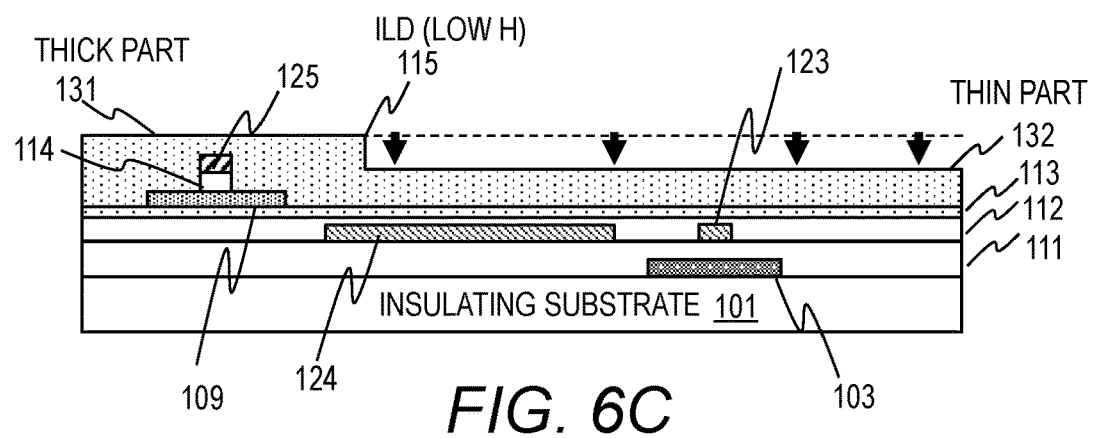
FIG. 6C is a diagram for illustrating a method of manufacturing a thin-film transistor substrate.

Next, with reference to FIG. 6C, the manufacturing etches the interlayer insulating film 115 by photolithography to form a thin part 132. The remaining unetched part of the interlayer insulating film 115 is a thick part 131. Either wet etching or dry etching can be employed.

Figure 6D:
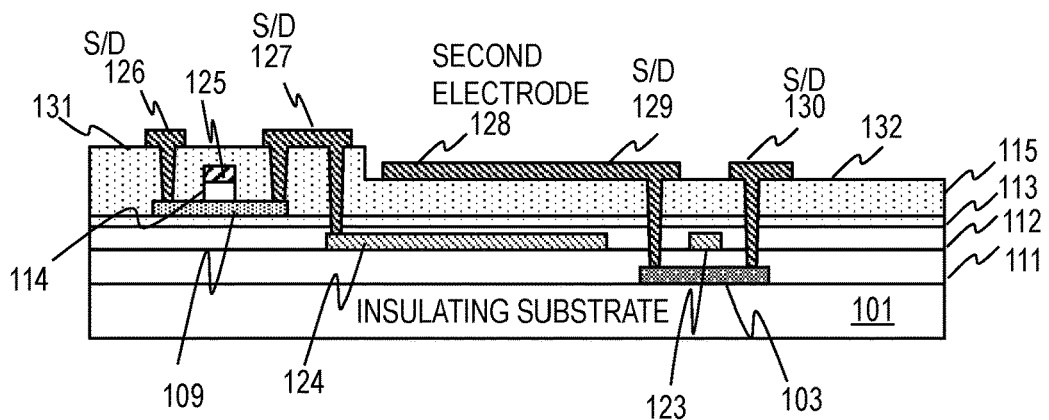
FIG. 6D is a diagram for illustrating a method of manufacturing a thin-film transistor substrate.

Next, with reference to FIG. 6D, the manufacturing opens contact holes in the stacked insulating films by anisotropic etching. Further, the manufacturing forms a third metal layer by sputtering and patterns the third metal layer by photolithography. The third metal layer can have a multilayer structure of Ti/Al/Ti, for example. The patterning forms source/drain electrodes 126, 127, 129, and 130 and a second electrode 128. Furthermore, data lines and power lines are formed together.

The source/drain electrode 126 is connected with the oxide semiconductor film 109 through a contact hole opened through the interlayer insulating film 115. The source/drain electrode 127 is connected with the oxide semiconductor film 109 and the first electrode 124 through interconnectors provided in contact holes. The source/drain electrodes 129 and 130 are connected with the low-temperature polysilicon film 103 through interconnectors provided in contact holes.

Figure 6E:
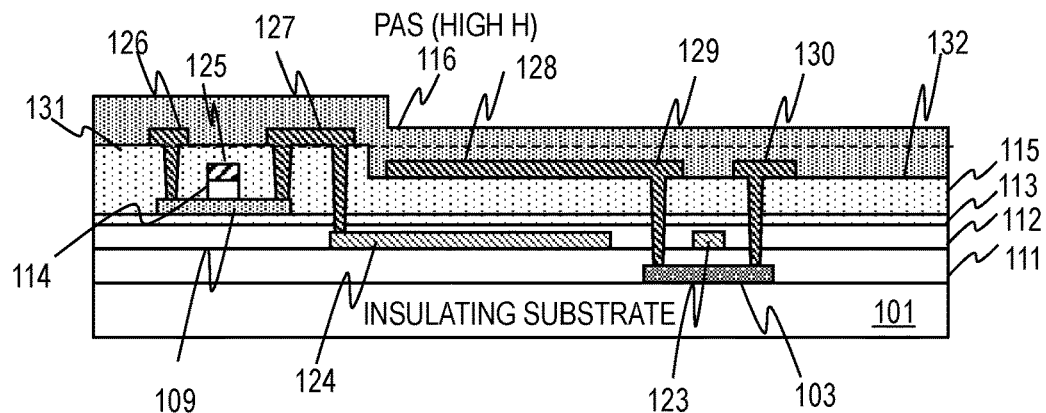
FIG. 6E is a diagram for illustrating a method of manufacturing a thin-film transistor substrate.

Next, with reference to FIG. 6E, the manufacturing forms a passivation film 116 by PECVD. The passivation film 116 is a hydrogen-rich insulating film such as a silicon nitride film produced by PECVD of hydrogen-containing material. After forming the passivation film 116, the manufacturing performs annealing. The annealing causes the passivation film 116 to effectively supply hydrogen to the low-temperature polysilicon film 103.

Figure 6F:
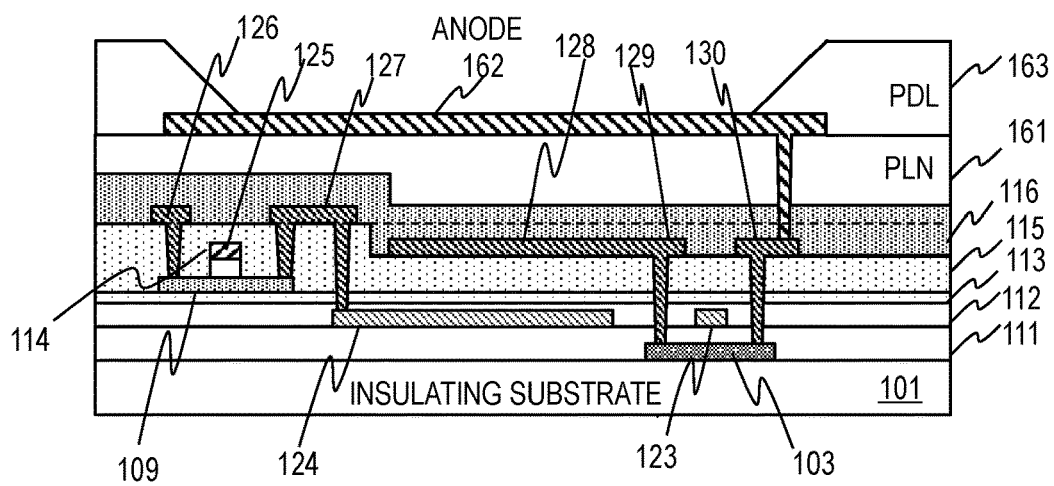
FIG. 6F is a diagram for illustrating a method of manufacturing a thin-film transistor substrate.

Next, with reference to FIG. 6F, the manufacturing deposits a photosensitive organic material on the entire substrate to form a planarization film 161 and opens a contact hole for connecting an anode electrode 162 to the source/drain electrode 130 by photolithography. The manufacturing forms the anode electrode 162 on the planarization film 161 with a contact hole by sputtering and patterning. Next, the manufacturing deposits a photosensitive organic resin film by spin coating and patterns the photosensitive organic resin film to form a pixel defining layer 163.

Although not shown in the drawings, the manufacturing forms an organic light-emitting film on the anode electrode 162 after forming the pixel defining layer 163. Forming the organic light-emitting film deposits an organic light-emitting material by vapor deposition at the location corresponding to a pixel through a metal mask. The manufacturing further deposits a metal material for the cathode electrode. The metal material deposited on the organic light-emitting film for one subpixel functions as a cathode electrode of this subpixel in the region of an opening of the pixel defining layer 163.

Other Embodiments

Figure 7:
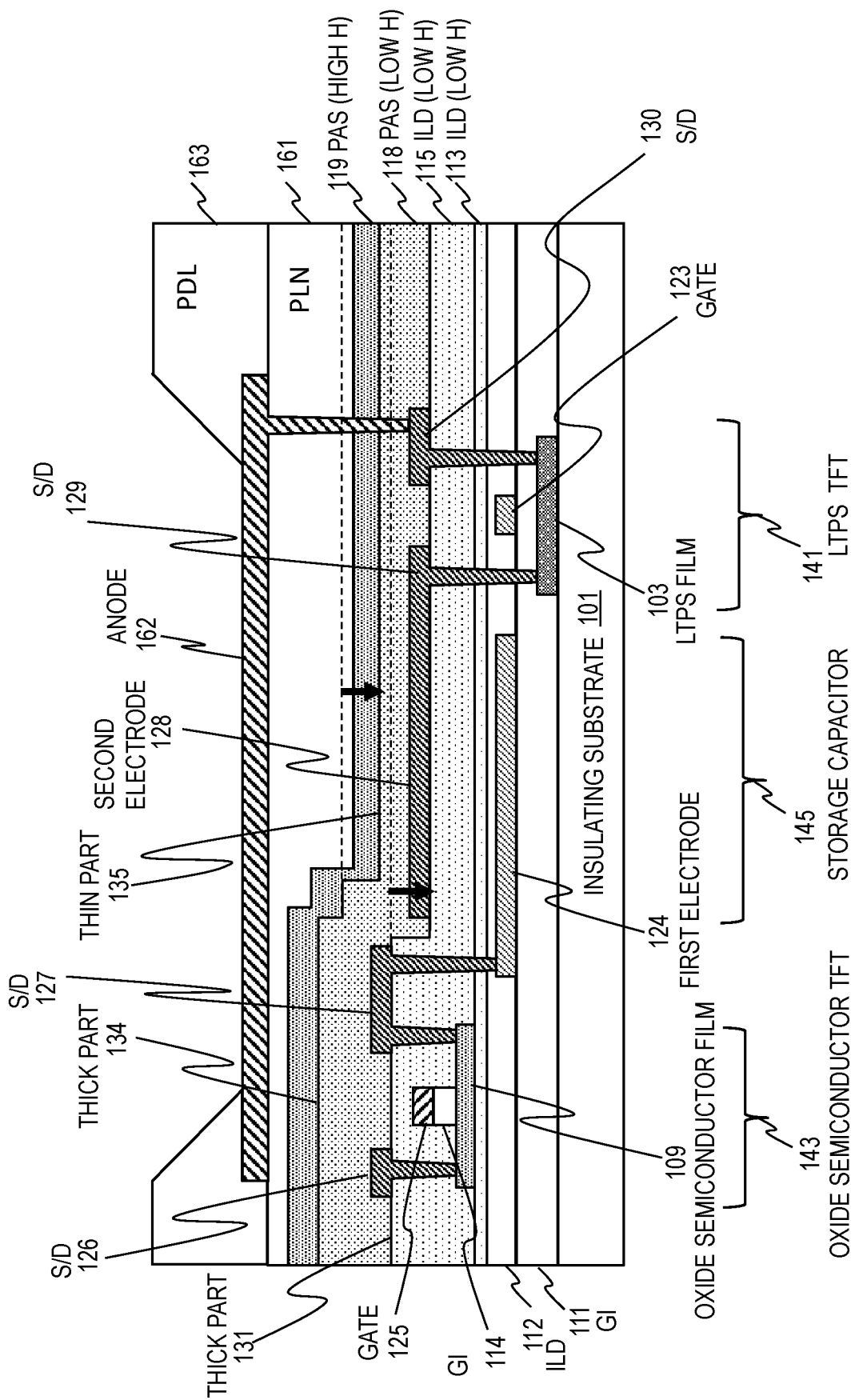
FIG. 7 schematically illustrates a cross-sectional structure of a part of a thin-film transistor substrate in another configuration example.

FIG. 7 schematically illustrates a cross-sectional structure of a part of a thin-film transistor substrate in another configuration example. The following mainly describes differences from the configuration example illustrated in FIG. 3. This configuration example includes a hydrogen-rich passivation film 119 in place of the hydrogen-rich passivation film 116 in the configuration example of FIG. 3. This configuration example further includes a hydrogen-poor passivation film 118 between the hydrogen-rich passivation film 119 and the hydrogen-poor interlayer insulating film 115. The hydrogen-rich passivation film 119 and the hydrogen-poor passivation film 118 are examples of a second insulating film and a third insulating film, respectively.

As illustrated in FIG. 7, the passivation film 118 is in contact with the passivation film 119 and the interlayer insulating film 115. The passivation film 118 is provided to cover the source/drain electrodes 126, 127, 129, and 130 and the second electrode 128. The passivation film 118 is in contact with and covers a part of the interlayer insulating film 115. The passivation film 118 is a hydrogen-poor insulating film; it can be made of the material that can be used for the interlayer insulating film 115.

The interlayer insulating film 118 has different thicknesses depending on the position. Specifically, when viewed in the layering direction (in a planar view), the part covering the low-temperature polysilicon film 103 is thinner than the part covering the oxide semiconductor film 109. The passivation film 118 in the configuration example of FIG. 7 has a thick part (a fourth part) 134 and a thin part (a third part) 135.

The thick part 134 covers the oxide semiconductor film 109. The thin part 135 covers the low-temperature polysilicon film 103. The passivation film 118 can be formed by PECVD and the thick part 134 and the thin part 135 are formed by etching, like the interlayer insulating film 115.

The passivation film 119 is laid above the passivation film 118. The layers upper than the passivation film 119 are the same as those in the configuration example of FIG. 3. The passivation film 119 is isolated from the oxide semiconductor film 109 by the hydrogen-poor interlayer insulating film 115 and the hydrogen-poor passivation film 118. The passivation film 119 is a hydrogen-rich insulating film; it can be made of the same material and by the same process as the passivation film 116 in the configuration example of FIG. 3. The concentration of the hydrogen in the passivation film 119 can be the same as that of the passivation film 116 in the configuration example of FIG. 3.

Manufacturing the thin-film transistor substrate forms the passivation film 118 after forming the interlayer insulating film 115 thereunder. After forming the passivation film 118, the manufacturing forms the passivation film 119 on the passivation film 118. After forming the passivation film 119, annealing is performed.

The passivation film 119 supplies hydrogen to the low-temperature polysilicon film 103 when the passivation film 119 is being formed or subsequently annealed. The supplied hydrogen terminates the dangling bonds at the crystal grain boundary of the low-temperature polysilicon film 103. The low-temperature polysilicon film 103 attains required characteristics with the hydrogen supplied from the passivation film 119.

As described above, the interlayer insulating film 115 and the passivation film 118 are thinner in the parts covering the low-temperature polysilicon film 103 than in the parts covering the oxide semiconductor film 109. This configuration makes the hydrogen-rich passivation film 119 closer to the low-temperature polysilicon film 103. The thick part 131 of the hydrogen-poor interlayer insulating film 115 and the thick part 134 of the passivation film 118 function as barrier films against hydrogen for the oxide semiconductor film 109.

Because of this difference in thickness of the interlayer insulating film 115 and the passivation film 118, the passivation film 119 can effectively supply hydrogen to the low-temperature polysilicon film 103 and further, reduce the effect of the hydrogen from the passivation film 119 onto the oxide semiconductor film 109 to achieve the characteristics desired for the oxide semiconductor film 109.

In the configuration example illustrated in FIG. 7, the thick part 134 of the passivation film 118 covers the entire oxide semiconductor film 109 when viewed planarly. This configuration effectively prevents degradation of the characteristics of the oxide semiconductor film 109. In another example, the thick part 134 of the passivation film 118 can cover only a part of the oxide semiconductor film 109.

In the configuration example illustrated in FIG. 7, the thin part 135 of the passivation film 118 covers the entire low-temperature polysilicon film 103 when viewed planarly. This configuration effectively prevents lack of hydrogen in the low-temperature polysilicon film 103. In another example, the thin part 135 of the passivation film 118 can cover only a part of the low-temperature polysilicon film 103.

Figure 8:
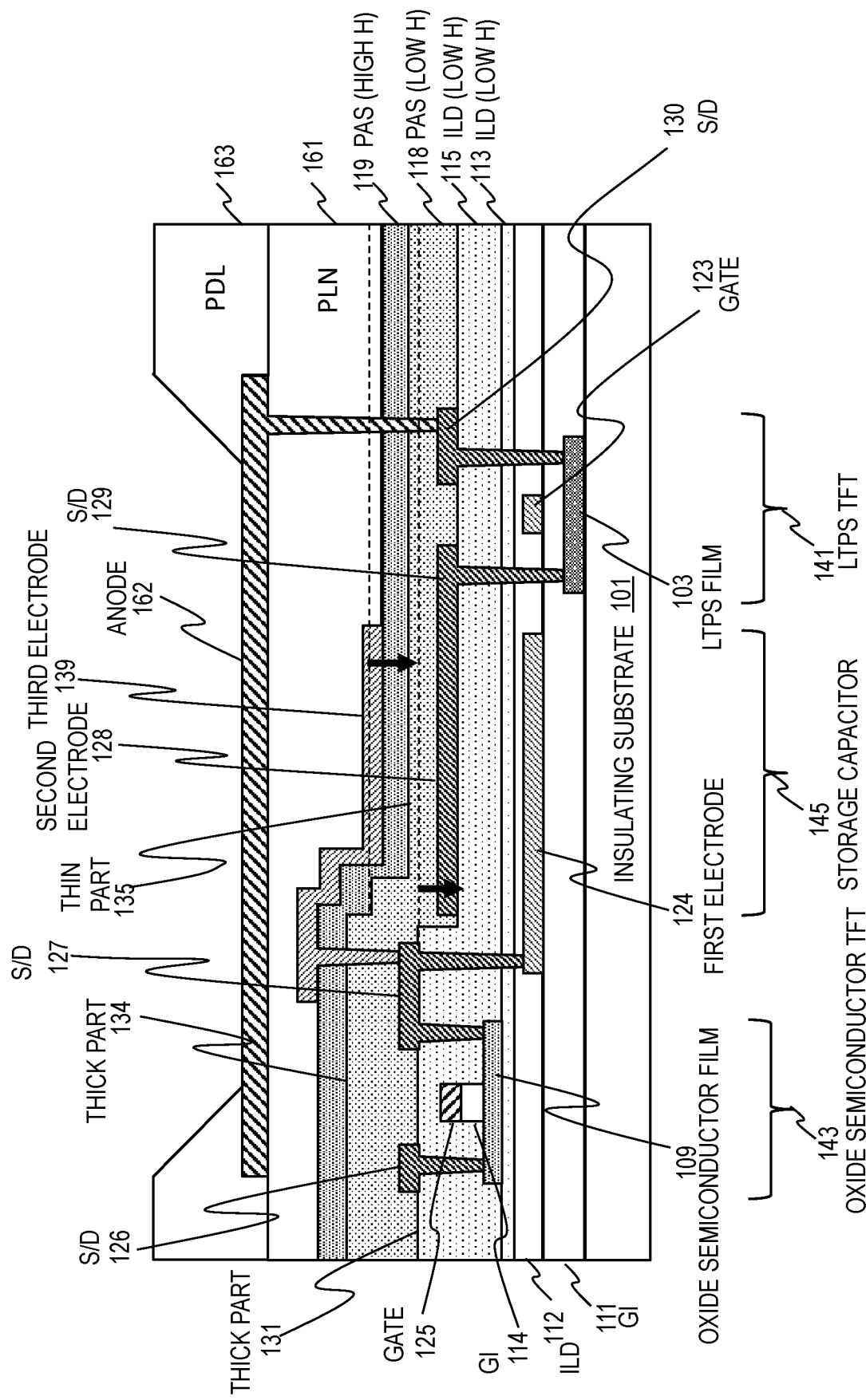
FIG. 8 schematically illustrates a cross-sectional structure of a part of a thin-film transistor substrate in still another configuration example.

FIG. 8 schematically illustrates a cross-sectional structure of a part of a thin-film transistor substrate in still another configuration example. The following mainly describes differences from the configuration example illustrated in FIG. 7. This configuration example illustrated in FIG. 8 includes a third electrode 139 included in the storage capacitor 145 in addition to the configuration example illustrated in FIG. 7. The third electrode 139 is located upper than the second electrode 128.

The third electrode 139 is provided above and in contact with the passivation film 119. The third electrode 139 is opposed to the second electrode 128 in the layering direction; a stack of a part of the passivation film 119 and a part of the passivation film 118 is sandwiched therebetween. The third electrode 139 is connected with the first electrode 124 through a contact hole opened through the passivation films 118 and 119 and the source/drain electrode 127 of the oxide semiconductor TFT 143. The first electrode 124 and the third electrode 139 are at the same potential. Because of the third electrode 139, the storage capacitor 145 attains higher capacitance.

In the configuration example of FIG. 8, a part of the thin part 135 of the passivation film 118 is located between the second electrode 128 and the third electrode 139. This configuration increases the capacitance of the storage capacitor 145. In the configuration example of FIG. 8, a part of the thick part 134 and a part of the thin part 135 of the passivation film 118 are located between the second electrode 128 and the third electrode 139.

The thinnest part of the passivation film 118 located between the second electrode 128 and the third electrode 139 can be thinner than the part covering the low-temperature polysilicon film 103, or thinner than the part covering the oxide semiconductor film 109 but thicker than the part covering the low-temperature polysilicon film 103. The part of the passivation film 118 located between the second electrode 128 and the third electrode 139 can be as thick as the part covering the oxide semiconductor film 109.

Manufacturing the thin-film transistor substrate forms the third electrode 139 after forming the passivation film 119 thereunder. Specifically, after opening a contact hole in the passivation films 119 and 118 by anisotropic etching, the manufacturing forms a metal film by sputtering and patterns the metal film by photolithography to form the third electrode 139. The third electrode 139 can be made of the same material and have the same configuration as the second electrode 128 or the first electrode 124.

The described next is an example where the configuration example in a display region illustrated in FIG. 3 is applied to a peripheral circuit. Peripheral circuits are disposed outside (in the periphery) of a display region where light-emitting elements are arrayed and they transmit signals for controlling the light-emitting elements. A peripheral circuit 37 can be the scanning driver 31, the emission driver 32, the protection circuit 33, or the demultiplexer 36. The peripheral circuit 37 is fabricated on the TFT substrate 10.

Figure 9:
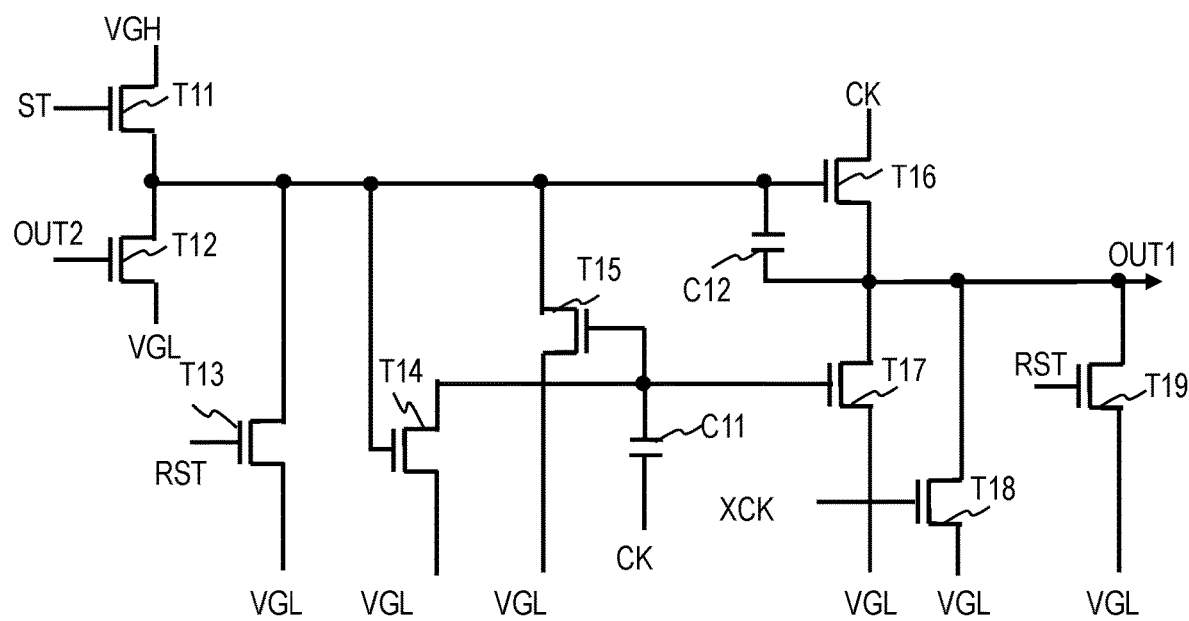
FIG. 9 illustrates a configuration example of a shift register circuit in still another configuration example.

FIG. 9 illustrates an example of a shift register circuit included in a scanning driver circuit. This circuit includes transistors T11 to T19 and storage capacitors C11 and C12. The potential VGH is a high power-supply potential and the potential VGL is a low power-supply potential. The signal ST is a start pulse or an output from the previous stage. The signal OUT1 is an output. The signal OUT2 is a feedback signal from the next stage. The signal RST is a reset signal. The signal CK is a clock signal and the signal XCK is an inversion clock signal.

In the circuit illustrated in FIG. 9, the transistors T16 to T19 are connected with an output terminal for the signal OUT1. The output terminal for the signal OUT1 has a large load capacity because it is connected with the pixels in the display regions. For this reason, the transistors T16 to T19 are required to have high driving capability. Accordingly, low-temperature polysilicon TFTs having high mobility can be employed for the transistors T16 to T19. On the other hand, the transistors T11 to T15 connected with the gate of the transistor T16 are required to generate less leakage current to maintain the gate potential of the transistor T16. Accordingly, oxide semiconductor TFTs can be employed for the transistors T11 to T15.

Figure 10:
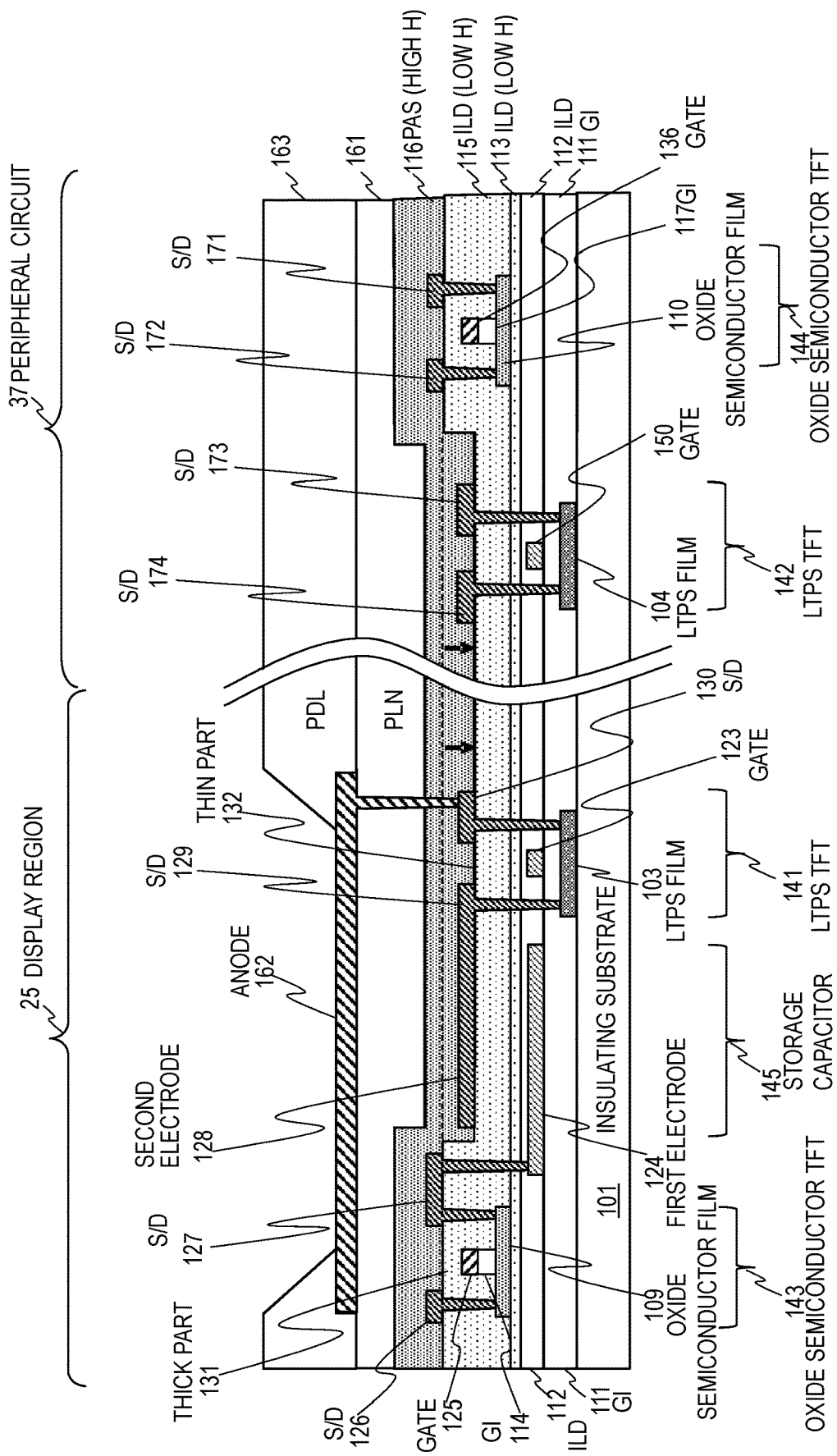
FIG. 10 schematically illustrates a cross-sectional structure of a part of a thin-film transistor substrate in the still another configuration example.

FIG. 10 schematically illustrates a cross-sectional structure of a part of a thin-film transistor substrate in this configuration example. The difference from the configuration example illustrated in FIG. 3 is that this configuration example includes a peripheral circuit 37. The peripheral circuit includes a low-temperature polysilicon TFT 142 and an oxide semiconductor TFT 144. The low-temperature polysilicon TFT 142 includes a low-temperature polysilicon film 104, a gate electrode 150, and source/drain electrodes 173 and 174. The oxide semiconductor TFT 144 includes an oxide semiconductor film 110, a gate electrode 136, and source/drain electrodes 171 and 172.

The interlayer insulating film 115 in the peripheral circuit 37 is thinner in the part covering the low-temperature polysilicon film 104 than in the part covering the oxide semiconductor film 110. This configuration makes the hydrogen-rich passivation film 116 closer to the low-temperature polysilicon film 104. The thick part 131 of the hydrogen-poor interlayer insulating film 115 functions as a barrier film against hydrogen for the oxide semiconductor film 110.

Because of this difference in thickness of the interlayer insulating film 115, the passivation film 116 can effectively supply hydrogen to the low-temperature polysilicon film 104 and further, reduce the effect of hydrogen from the passivation film 116 onto the oxide semiconductor film 110 to achieve the characteristics desired for the oxide semiconductor film 110.

The hydrogen effectively supplied from the passivation film 116 to the low-temperature polysilicon film 104 enables the low-temperature polysilicon TFTs in the peripheral circuit 37 to have desired characteristics for higher driving capability. As a result, the peripheral circuit 37 can have a narrower width and achieve high-speed driving.

Figure 11:
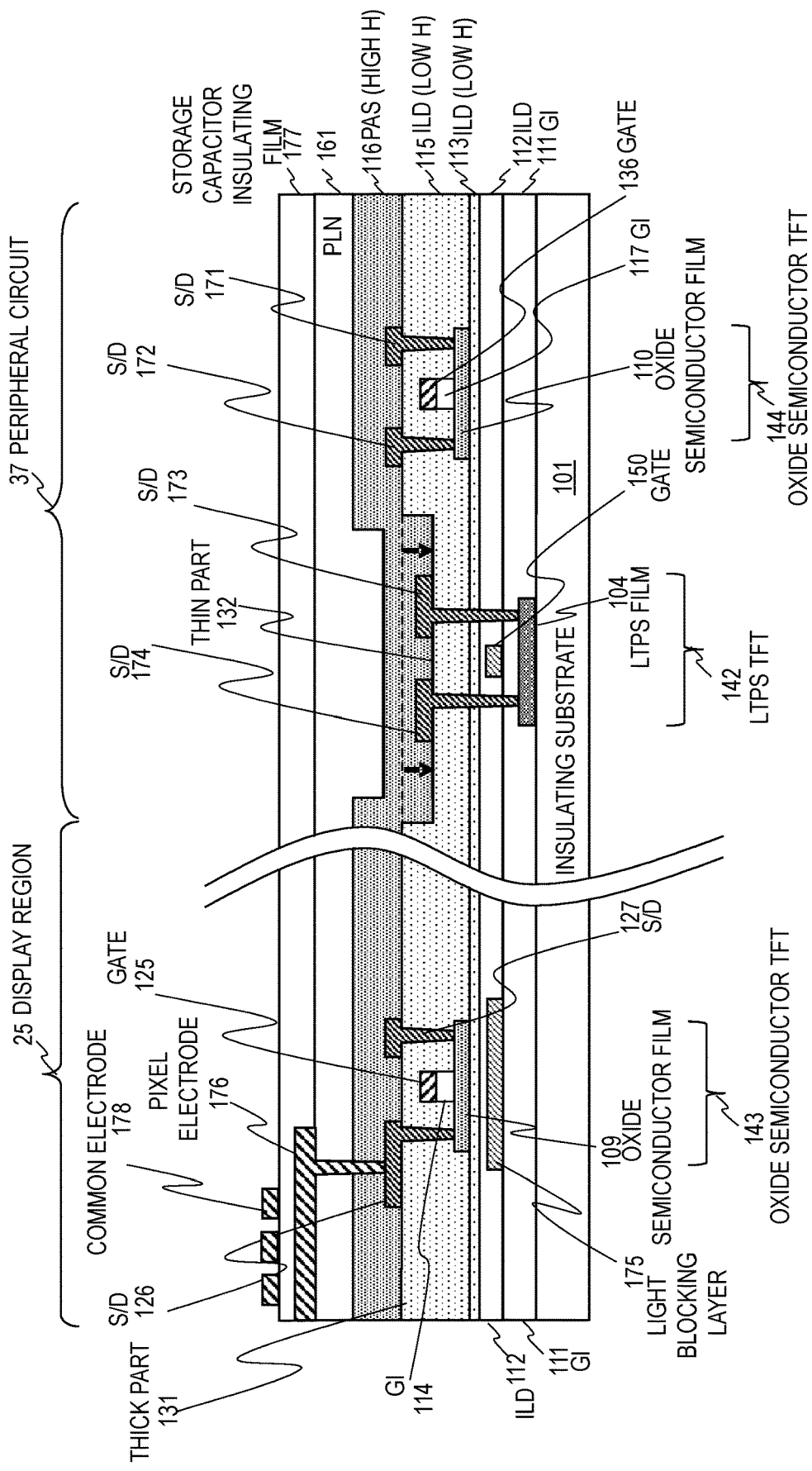
FIG. 11 schematically illustrates a cross-sectional structure of a part of a thin-film transistor substrate in yet another configuration example.

FIG. 11 schematically illustrates a cross-sectional structure of a part of a thin-film transistor substrate in yet another configuration example. This example is a configuration applied to a thin-film transistor substrate for a liquid crystal display device. The following mainly describes differences from the configuration example illustrated in FIG. 10. The configuration example of FIG. 11 includes an oxide semiconductor TFT 143 in a display region 25. The oxide semiconductor TFT 143 drives liquid crystal (not shown) with electric charges stored in the storage capacitor insulating film 177 between a pixel electrode 176 and a common electrode 178. Further, a light-blocking layer 175 is provided under the oxide semiconductor film 109 of the oxide semiconductor TFT 143.

In the configuration example of FIG. 11, the interlayer insulating film 115 is thinner in the part covering the low-temperature polysilicon film 104 in the peripheral circuit than in the part covering the oxide semiconductor films 109 and 110. Accordingly, the passivation film 116 can effectively supply hydrogen to the low-temperature polysilicon film 104 and further, reduce the effect of the hydrogen from the passivation film 116 onto the oxide semiconductor films 109 and 110 to achieve the characteristics desired for the oxide semiconductor films 109 and 110.

The hydrogen effectively supplied from the passivation film 116 to the low-temperature polysilicon film 104 enables the low-temperature polysilicon TFT 142 in the peripheral circuit 37 to have desired characteristics for higher driving capability. As a result, the peripheral circuit 37 can have a narrower width and achieve high-speed driving. This configuration example can include a low-temperature polysilicon TFT in the display region 25.

Figure 12:
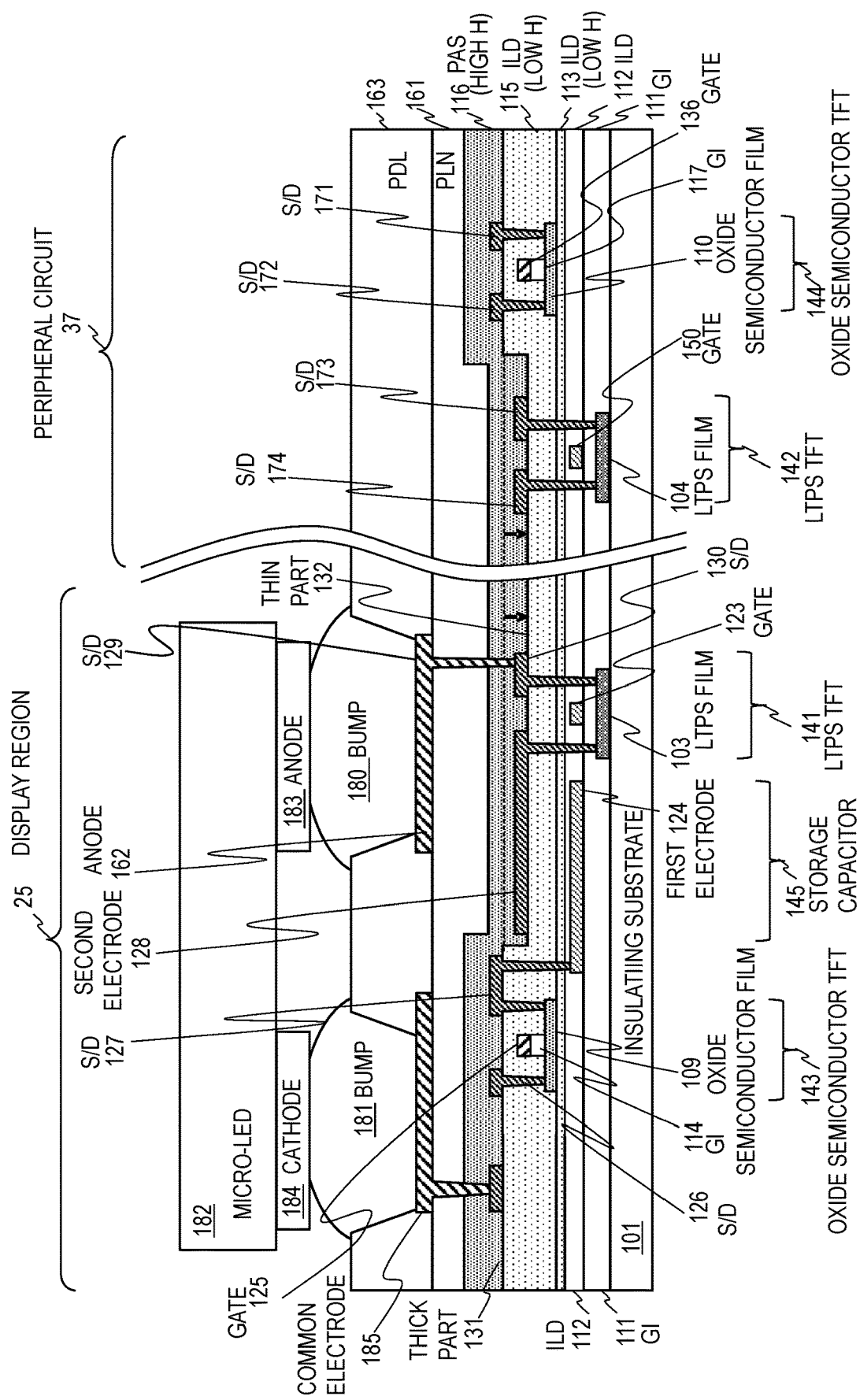
FIG. 12 schematically illustrates a cross-sectional structure of a part of a thin-film transistor substrate in yet another configuration example.

FIG. 12 schematically illustrates the cross-sectional structure of a part of a thin-film transistor substrate in yet another configuration example. This example is a configuration applied to a thin-film transistor substrate for a micro-LED display device. The following mainly describes differences from the configuration example illustrated in FIG. 10. The configuration example of FIG. 12 includes bumps 180 and 181, a micro-LED 182, an anode electrode 183 of the micro-LED 182, and a cathode electrode 184 of the micro-LED 182 in addition to the configuration example of FIG. 10. The anode electrode 183 of the micro-LED 182 is connected with the anode electrode 162 through the bump 180. The cathode electrode 184 of the micro-LED 182 is connected with the common electrode 185 through the bump 181. The bumps can be solder bumps (Ag/Sn) or made of Au or Cu.

The example of FIG. 12 can be used for a pixel circuit in FIG. 2A, 2B or 2C. The low-temperature polysilicon TFT 141 having high mobility can be used as a driving transistor for the micro-LED 182. The oxide semiconductor TFT 143 that generates small leakage current can be used as a switch transistor connected with the storage capacitor 145 for maintaining the gate potential of the driving transistor.

In the configuration example of FIG. 12, the interlayer insulating film 115 in the display region 25 and the peripheral circuit 37 is thinner in the parts covering the low-temperature polysilicon films 103 and 104 than in the parts covering the oxide semiconductor films 109 and 110. Accordingly, the passivation film 116 can effectively supply hydrogen to the low-temperature polysilicon films 103 and 104 and further, reduce the effect of the hydrogen from the passivation film 116 onto the oxide semiconductor films 109 and 110 to achieve the characteristics desired for the oxide semiconductor films 109 and 110.

The hydrogen effectively supplied from the passivation film 116 to the low-temperature polysilicon films 103 and 104 enables the low-temperature polysilicon TFTs 141 and 142 to have desired characteristics for higher driving capability. As a result, the peripheral circuit 37 can have a narrower width and achieve high-speed driving.

Figure 13:
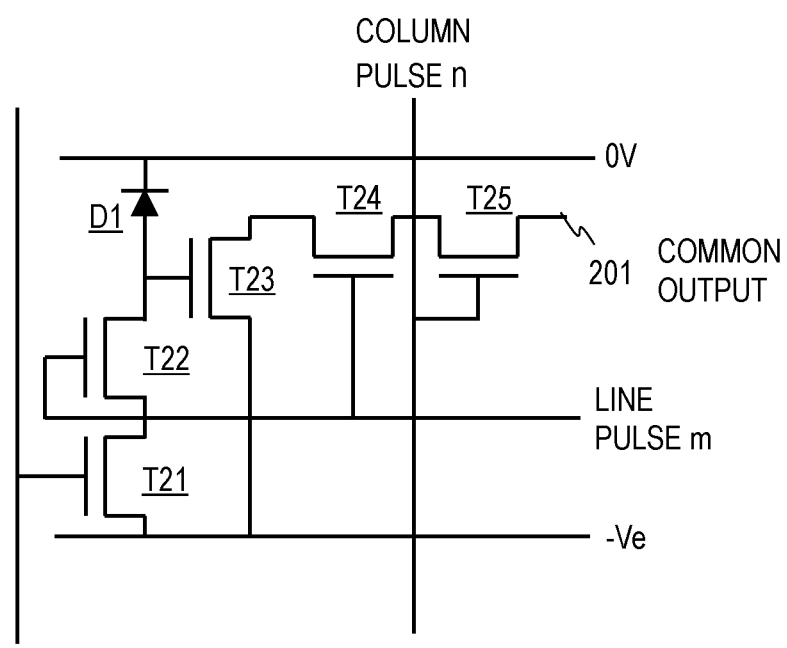
FIG. 13 illustrates a configuration example of a sensor circuit in still another configuration example.

The described next is an example where the thin-film transistor substrate of this disclosure is applied to a sensor array where sensors such as photodiodes are arrayed. FIG. 13 is an equivalent circuit diagram of a unit pixel of the sensor array. The equivalent circuit includes transistors T21 to T25 and a diode D1. In a period where the transistors T24 and T25 are in a conductive state in accordance with a COLUMN PULSE n signal and a LINE PULSE m signal, the transistor T23 outputs the voltage of the diode D1 to a COMMON OUTPUT line 201. That is to say, the signal is amplified and buffered by the transistor T23 before being output.

Accordingly, noise is difficult to be mixed on the output line to attain high S/N ratio. In this circuit, low-temperature polysilicon TFTs having high mobility can be employed for the transistors T23, T24, and T25 on the path for outputting the voltage of the diode D1 to the COMMON OUTPUT line 201. On the other hand, oxide semiconductor TFTs that generate small leakage current can be employed for the transistors T21 and T22 in order to accurately maintain the voltage of the diode D1.

Figure 14:
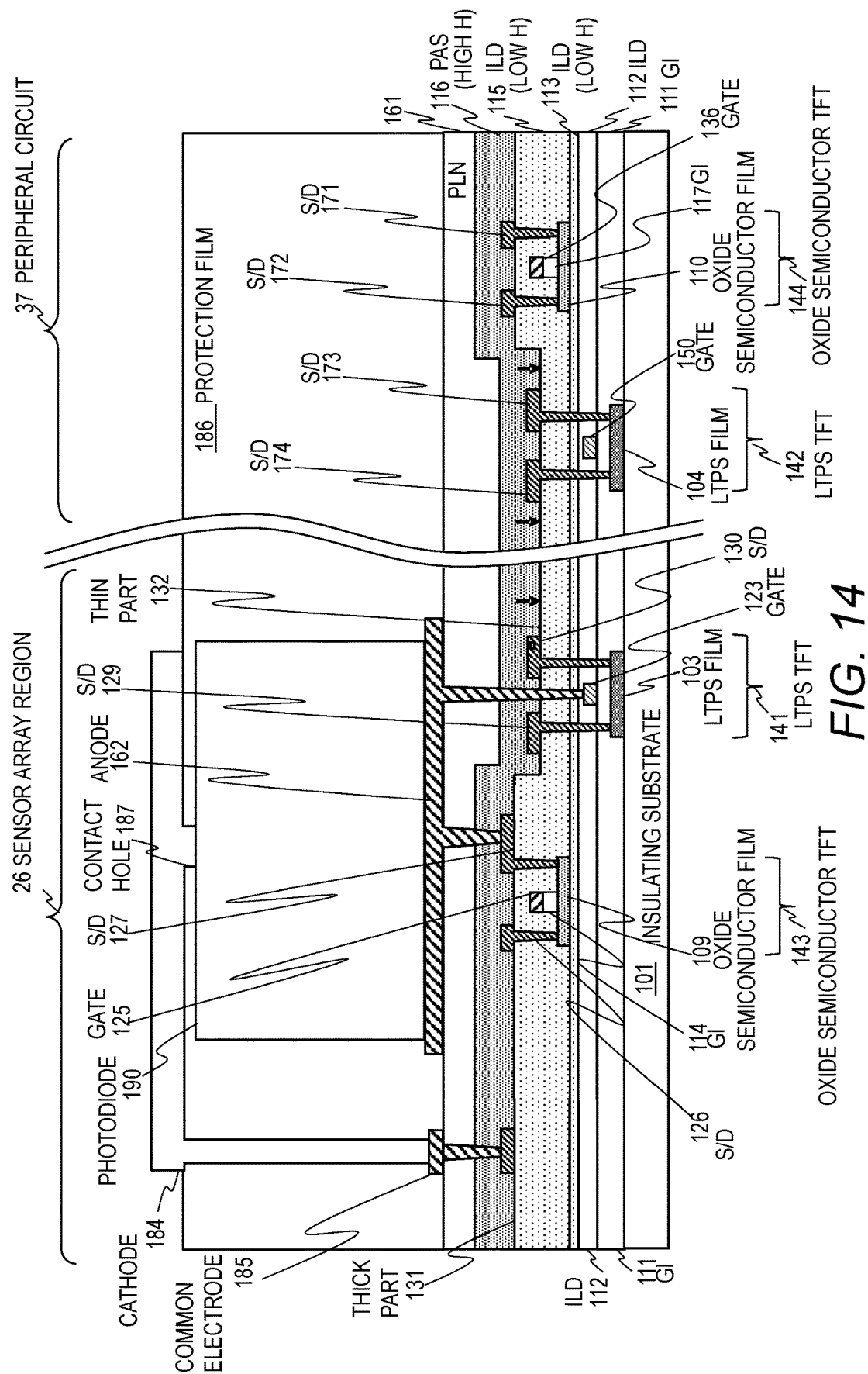
FIG. 14 schematically illustrates a cross-sectional structure of a part of a thin-film transistor substrate in the still another configuration example.

FIG. 14 schematically illustrates a cross-sectional structure of a part of a thin-film transistor substrate in this configuration example. The following mainly describes differences from the configuration example illustrated in FIG. 10. The configuration example of FIG. 14 includes a photodiode 190, a protection film 186, a cathode electrode 184, a common electrode 185, and a contact hole 187, in addition to the configuration of FIG. 10. One end of the photodiode 190 is connected with the anode electrode 162. The other end of the photodiode 190 is connected with the cathode electrode 184 through the contact hole 187 and further, connected with the common electrode 185.

In the configuration example of FIG. 14, the interlayer insulating film 115 in the sensor array region 26 and the peripheral circuit 37 is thinner in the parts covering the low-temperature polysilicon films 103 and 104 than in the parts covering the oxide semiconductor films 109 and 110. Accordingly, the passivation film 116 can effectively supply hydrogen to the low-temperature polysilicon films 103 and 104 and further, reduce the effect of the hydrogen from the passivation film 116 onto the oxide semiconductor films 109 and 110 to achieve the characteristics desired for the oxide semiconductor films 109 and 110. Accordingly, unexpected variation in voltage of the diode D1 is reduced to attain high S/N ratio.

The hydrogen effectively supplied from the passivation film 116 to the low-temperature polysilicon films 103 and 104 enables the low-temperature polysilicon TFTs 141 and 142 to have desired characteristics for higher driving capability. As a result, the voltage signal of the diode D1 is amplified to attain high S/N ratio. In addition to this, the peripheral circuit 37 can have a narrower width and achieve high-speed driving.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A thin-film transistor substrate comprising:
   an insulating substrate;
   a first thin-film transistor disposed on the insulating substrate and including an active film as a polysilicon film;
   a second thin-film transistor disposed on the insulating substrate and including an active film as an oxide semiconductor film located above the polysilicon film;
   a first insulating film located above the polysilicon film and the oxide semiconductor film, the first insulating film being in contact with the oxide semiconductor film and covering at least a part of the polysilicon film and at least a part of the oxide semiconductor film when viewed planarly;
   a second insulating film located above the first insulating film, the second insulating film covering the at least a part of the polysilicon film and the at least a part of the oxide semiconductor film when viewed planarly and containing hydrogen at a concentration higher than a concentration of hydrogen in the first insulating film;
   a first electrode included in a same layer as a gate electrode of the first thin-film transistor; and
   a second electrode located above the first electrode and included in a same layer as a source/drain electrode of the first thin-film transistor, and
   wherein the oxide semiconductor film has no overlapping areas with the polysilicon film when viewed planarly,
      wherein the first insulating film includes a first part and a second part,
      wherein the first part covers at least a part of the polysilicon film,
      wherein the second part covers at least a part of the oxide semiconductor film,
      wherein the first part of the first insulating film is thinner than the second part of the first insulating film, and
   wherein the first part includes a part sandwiched between the first electrode and the second electrode.

2. The thin-film transistor substrate according to claim 1, wherein the second insulating film is in contact with the first insulating film.

3. The thin-film transistor substrate according to claim 1, further comprising a third insulating film located between the first insulating film and the second insulating film,
   wherein a concentration of hydrogen in the third insulating film is lower than a concentration of hydrogen in the second insulating film,
   wherein the third insulating film includes a fourth part and a fifth part,
   wherein the fourth part covers at least a part of the polysilicon film,
   wherein the fifth part covers at least a part of the oxide semiconductor film, and
   wherein the fourth part of the third insulating film is thinner than the fifth part of the third insulating film.

4. The thin-film transistor substrate according to claim 3, further comprising:
   a third electrode located upper than the second electrode,
   wherein the fourth part includes a part sandwiched between the second electrode and the third electrode.

5. The thin-film transistor substrate according to claim 1, further comprising a light-emitting element on the insulating substrate,
   wherein the first thin-film transistor and the second thin-film transistor are included in a pixel circuit configured to control light emission of the light-emitting element,
   wherein the first thin-film transistor is a driving thin-film transistor configured to supply electric current to the light-emitting element, wherein the second thin-film transistor is a switch transistor, and wherein the pixel circuit includes a storage capacitor configured to maintain a gate potential of the driving thin-film transistor, wherein the storage capacitor includes the first electrode and the second electrode.

6. The thin-film transistor substrate according to claim 5, further comprising:
- a display region in which a plurality of light-emitting elements including the light-emitting element are arrayed on the insulating substrate; and
- a peripheral circuit disposed on the insulating substrate, the peripheral circuit being located outside the display region and configured to transmit a signal configured to control each of the plurality of light-emitting elements, wherein the peripheral circuit includes another first thin-film transistor.

7. The thin-film transistor substrate according to claim 1, further comprising:
- a display region in which a plurality of pixel electrodes and a common electrode are arrayed on the insulating substrate; and
- a peripheral circuit disposed on the insulating substrate, the peripheral circuit being located outside the display region and configured to transmit a signal configured to control electric charges to be stored between each of the plurality of pixel electrodes and the common electrode, wherein the second thin-film transistor in the display region is a thin-film transistor configured to supply electric charges to one of the plurality of pixel electrodes, and wherein the peripheral circuit includes the first thin-film transistor.

8. The thin-film transistor substrate according to claim 1, further comprising:
- a display region in which a plurality of pixel electrodes and a common electrode are arrayed on the insulating substrate; and
- a peripheral circuit disposed on the insulating substrate, the peripheral circuit being located outside the display region and configured to transmit a signal configured to control electric charges to be stored between each of the plurality of pixel electrodes and the common electrode, wherein the first thin-film transistor in the display region is a thin-film transistor configured to supply electric charges to one of the plurality of pixel electrodes, and wherein the peripheral circuit includes another first thin-film transistor and the second thin-film transistor.

9. The thin-film transistor substrate according to claim 5, wherein the light-emitting element is a micro-LED.

10. The thin-film transistor substrate according to claim 1, further comprising:
- a sensor array region in which a plurality of sensor elements are arrayed on the insulating substrate; and
- a peripheral circuit disposed on the insulating substrate, the peripheral circuit being located outside the sensor array region and configured to transmit a signal configured to control the plurality of sensor elements, wherein the first thin-film transistor and the second thin-film transistor are included in a sensor circuit configured to control one of the plurality of sensor elements, and wherein the peripheral circuit includes another first thin-film transistor.

* * * * *